(12) United States Patent
Kuboi et al.

(10) Patent No.: US 10,998,174 B2
(45) Date of Patent: May 4, 2021

(54) DRY ETCHING EQUIPMENT AND METHOD FOR PRODUCING SEMICONDUCTOR DEVICE

(75) Inventors: Nobuyuki Kuboi, Tokyo (JP); Tetsuya Tatsumi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 134 days.

(21) Appl. No.: 12/332,119

(22) Filed: Dec. 10, 2008

(65) Prior Publication Data
US 2009/0162950 A1 Jun. 25, 2009

(30) Foreign Application Priority Data
Dec. 19, 2007 (JP) .............................. JP2007-326966

(51) Int. Cl.
*H01L 21/02* (2006.01)
*H01L 21/3065* (2006.01)
*H01J 37/32* (2006.01)

(52) U.S. Cl.
CPC .... *H01J 37/3299* (2013.01); *H01J 37/32935* (2013.01)

(58) Field of Classification Search
CPC .................................................. H01J 37/3299
USPC ..................................................... 156/345.24
See application file for complete search history.

(56) References Cited

U.S. PATENT DOCUMENTS

| | | | |
|---|---|---|---|
| 5,421,934 A * | 6/1995 | Misaka et al. .......... | H01L 21/30 216/59 |
| 5,711,843 A * | 1/1998 | Jahns ..................... | B24B 37/013 156/345.24 |
| 5,812,435 A * | 9/1998 | Fujinaga ............... | G06F 17/5018 700/117 |
| 6,733,618 B2 * | 5/2004 | Kagoshima et al. .... | 156/345.24 |
| 2003/0003607 A1 * | 1/2003 | Kagoshima et al. ........... | 438/14 |
| 2005/0071038 A1 | 3/2005 | Strang | |
| 2005/0278060 A1 * | 12/2005 | Furuya ......................... | 700/182 |
| 2007/0122920 A1 * | 5/2007 | Bornstein et al. ................. | 438/5 |

FOREIGN PATENT DOCUMENTS

| | | |
|---|---|---|
| JP | 07-201757 | 8/1995 |
| JP | 08-177796 | 1/1996 |
| JP | 10-064774 | 3/1998 |
| JP | 2002-305191 | 10/2002 |
| JP | 2004-025058 | 1/2004 |
| JP | 2005-277361 | 10/2005 |
| JP | 2007-507886 | 3/2007 |

* cited by examiner

*Primary Examiner* — Parviz Hassanzadeh
*Assistant Examiner* — Nathan K Ford
(74) *Attorney, Agent, or Firm* — Sheridan Ross P.C.

(57) ABSTRACT

A dry etching equipment includes a topography simulator and a control section. The topography simulator controls an amount of deposition species incident upon a sidewall to be processed in accordance with a wafer opening ratio and a solid angle of a local pattern, the deposition amount being represented by a product of a reaction product flux and the solid angle. The control section compares a database obtained by the topography simulator with an actual measured value detected from an etching condition during dry etching to calculate a correction value for etching process, and indicates the correction value to an etching chamber in the dry etching equipment. The dry etching equipment corrects in real time a parameter for the etching process conducted in the etching chamber.

10 Claims, 17 Drawing Sheets

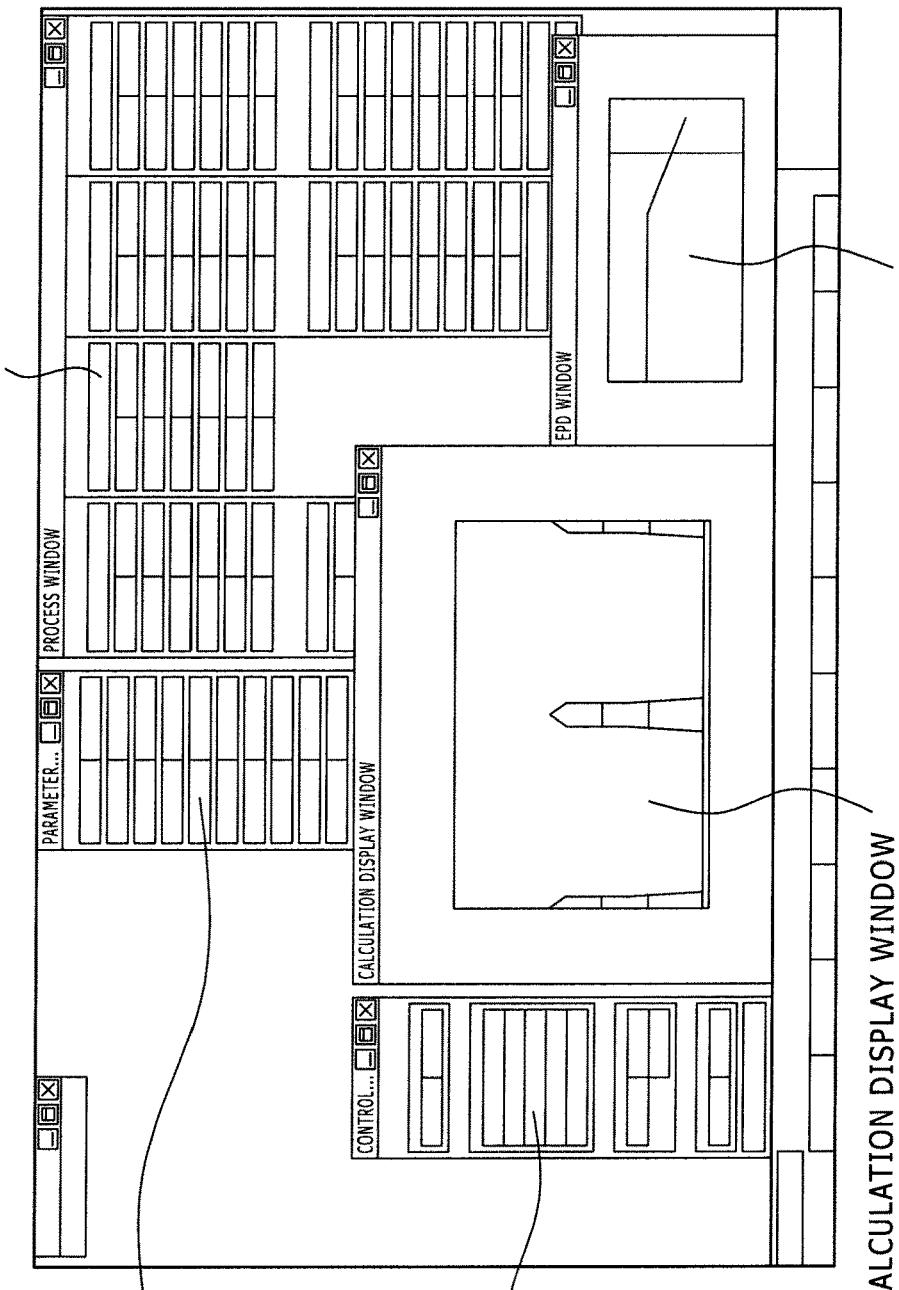

FIG. 2

PARAMETER WINDOW
INITIAL CONDITIONS REQUIRED
FOR CALCULATION AND EPD
SETTING ARE MADE.

CONTROL WINDOW
PARAMETER WINDOW, EPD WINDOW
CALCULATION DISPLAY,
MEASUREMENT WINDOW, AND
OTHERS ARE CONTROLLED.

PROCESS WINDOW
ETCHING CONDITIONS ARE SET.

EPD WINDOW
EPD WAVEFORM IS DISPLAYED.

CALCULATION DISPLAY WINDOW
TOPOGRAPHY IS DISPLAYED IN REAL-TIME.
IN ADDITION, ETCHING RATE AND ETCHING TIME ARE DISPLAYED.

FIG. 4
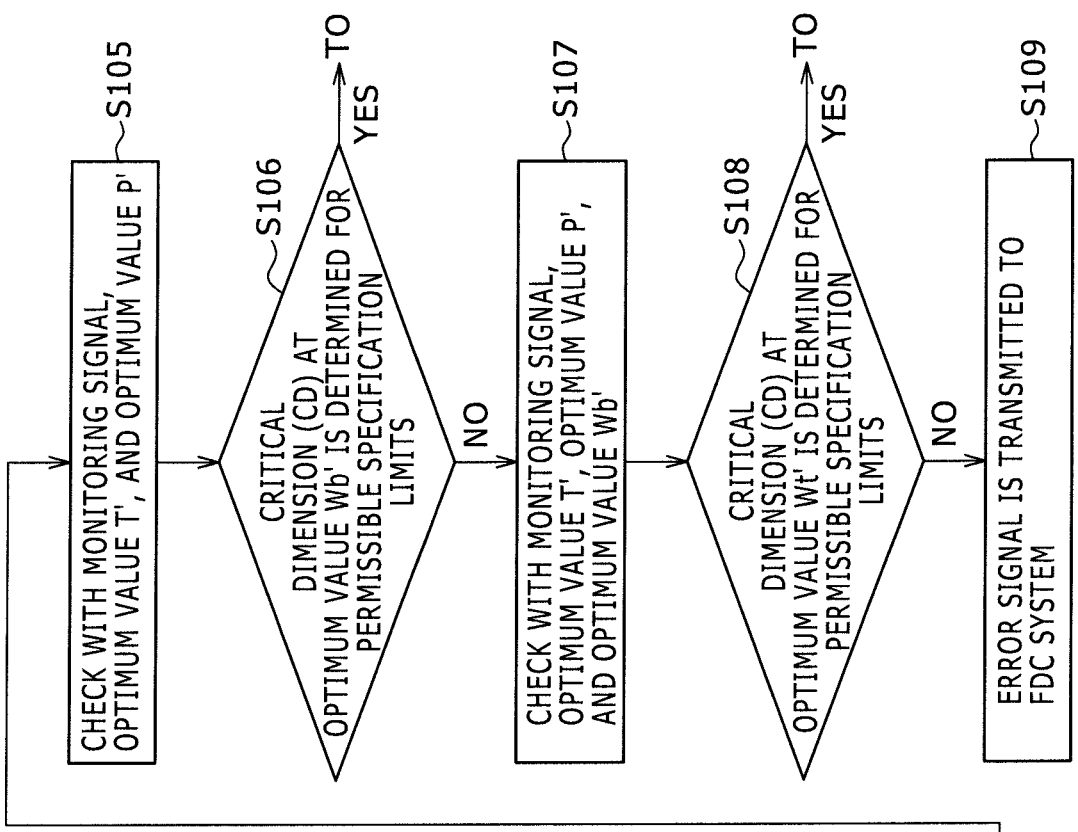
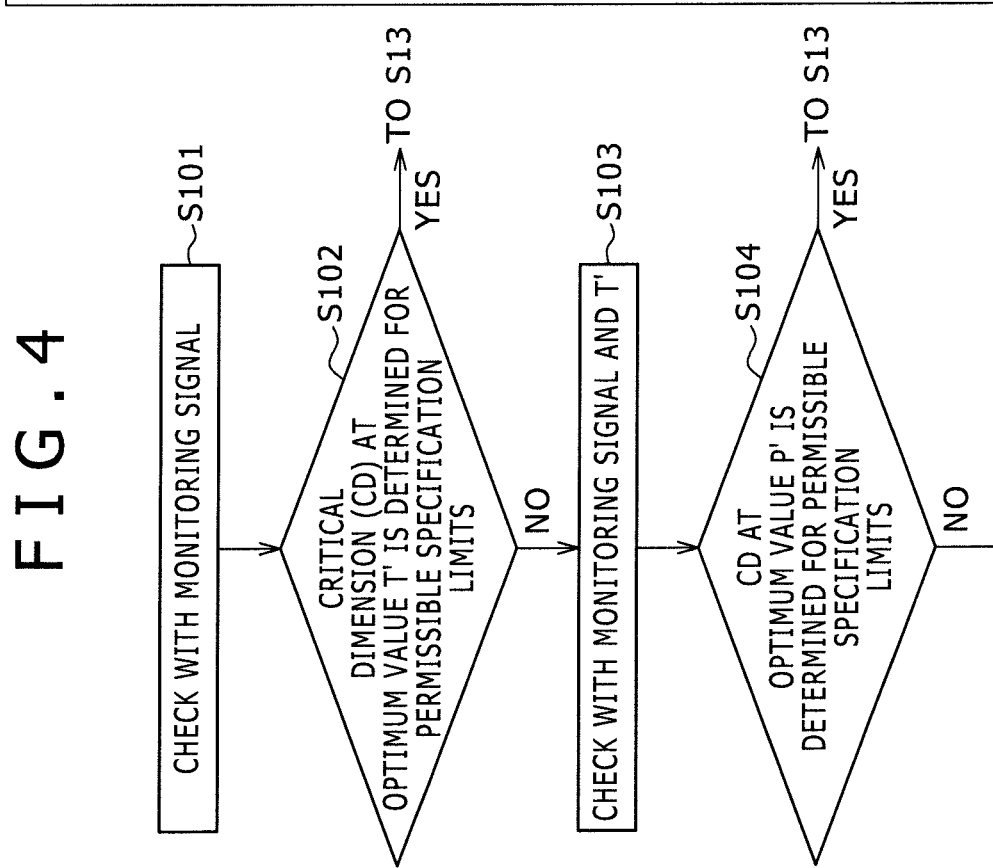

- DEPENDING ON SOLID ANGLE S
- DEPENDING ON GLOBAL OPENING RATIO R
- FLUX Γ (S, R)

FLUX DISTRIBUTION

CHANGE OF FLUX WITH TIME

DRY ETCHING EQUIPMENT AND METHOD FOR PRODUCING SEMICONDUCTOR DEVICE

CROSS-REFERENCE TO RELATED APPLICATIONS

The present application claims benefit of priority of Japanese patent Application No. 2007-326966 filed in the Japanese Patent Office on Dec. 19, 2007, the entire disclosure of which is incorporated herein by reference.

BACKGROUND OF THE INVENTION

1. Field of the Invention

The present invention relates to a dry etching equipment and a method for producing a semiconductor device.

2. Description of Related Art

A semiconductor device fabrication processes includes an impurity doping step, a deposition step, a lithography step for forming a mask pattern, an etching step for processing a thin film deposited or a substrate using the mask pattern as an etching mask, a cleaning step, and others.

The etching steps include a dry etching step and a wet etching step. When focusing attention to the dry etching step, there are two technical issues to be solved.

One of them is to control a critical dimension (CD).

The other is to optimize an etching rate control value (threshold) of a fault detection and classification (FDC) system.

To control the critical dimension (CD), a dry etching equipment having mounted thereon a process correction system called advanced process control (APC) is widely used in a semiconductor production line.

This system automatically controls the process on the basis of the correction conditions which are preliminarily set. However, for achieving correction with high accuracy, a great amount of actual measured data measured by a process engineer are required for each mask, which results in limiting the accuracy of actual correction.

In the current production line, a method for correction is employed in which a process engineer determines etching conditions by examination or optical proximity correction (OPC) is repeated to determine etching conditions and a variation in the conditions between wafers or lots is finely corrected by using a process correction system (APC). In the fine correction, for example, an etching time is mainly controlled.

For this reason, a serious problem arises in that man-hours for development per device or the cost for mask is increased.

With respect to a more automated system, a method has been proposed in which an amount of ions in plasma gas is monitored and a microwave power is corrected in real time so that the amount of ions incident upon a target is constant (see, for example, Japanese Unexamined Patent Application Publication No. H08-17796 (Patent Document 1)).

Further, a system has been proposed in which, using monitoring values for the dry etching equipment (plasma data, a pressure, a temperature, and the like) as initial values, the results of an on-tool or stand-alone model simulator (a plurality of optimized process parameters) are fed back to the dry etching equipment, automatically controlling the process to achieve desired topography (see, for example, Published PCT Application Publication No. 2007-507886 (Patent Document 2)).

By the way, from the measurement of a critical dimension (CD) of a transistor gate by the present inventors, it has been found that, as shown in FIG. 16, there is a correlation between a wafer opening ratio and a gate dimension transfer difference $\Delta CD$.

As shown in FIG. 17, the relationship between an opening ratio of a local region (two-dimensional area of a region to be etched) and a gate dimension transfer difference $\Delta CD$ varies depending on the pattern topography or pattern space, and thus the relationship does not have a constant relationship.

Further, it has been found that, as shown in FIG. 18, there is a correlation between a solid angle (three-dimensional angle indicating a region of field of view which can be seen from a certain target point) of a local pattern and a gate dimension transfer difference $\Delta CD$.

In a known optical proximity correction, correction is made by using a local opening ratio, and therefore the critical dimension deviates from a desired critical dimension.

Considering the above two factors, for achieving the critical dimension control with accuracy, it becomes very important to control an amount of deposition species, i.e., a product value of a reaction product flux due to the etching (depending on the wafer opening ratio) and a solid angle of a local pattern by correcting the process parameter.

However, in the known process correction system or the control methods typified by the patent documents 1 and 2, effects of the wafer opening ratio and the solid angle and a change thereof with time are not taken into consideration. Consequently, the process correction system and the control methods are not enough to meet a requirement of etching for a next generation of devices which prevent a variation on the nanometer scale in the critical dimension (CD). For example, a 65-nm generation of devices requires an accuracy of $\pm 3$ nm ($3\sigma$) in the control of critical dimension (CD).

In the production line, for detecting a fault in the process and improving the productivity, a fault detection and classification (FDC) system for detecting and classifying a fault is mounted on the etching equipment.

With respect to the dry process control value for the FDC section, particularly, with respect to the etching rate, a predetermined rate value and its threshold are manually determined on the basis of the results of actual measurement.

However, the value is not determined while considering a change of the critical dimension (CD) in the range of the rate threshold.

An effective method for determining in real time an etching rate control value (rate threshold) and detecting a fault with higher accuracy to achieve a desired critical dimension (CD) within the range of tolerance limits is desired.

SUMMARY OF THE INVENTION

Thus, a known topography simulator makes simulation of etching topography on the basis of the local opening ratio, thereby making it difficult to control a variation on the nanometer scale in the critical dimension (CD).

Accordingly, it is desirable to control a variation on the nanometer scale in the critical dimension (CD), by correcting the etching conditions in accordance with a wafer opening ratio and a solid angle of a local pattern to control the amount of deposition species incident upon a sidewall to be processed.

In accordance with an embodiment of the present invention, there is provided a dry etching equipment including a topography simulator and a control section. The topography simulator controls an amount of deposition species incident upon a sidewall to be processed in accordance with a wafer opening ratio and a solid angel of a local pattern, wherein the amount of deposition species is represented by a product of a reaction product flux and the solid angle. The controls section compares a database obtained by the topography simulator with an actual measured value detected from an etching condition during dry etching to calculate a correction value for etching process, and indicates the correction value to an etching chamber in the dry etching equipment. The dry etching equipment corrects in real time a parameter for the etching process conducted in the etching chamber.

The dry etching equipment by an embodiment of the present invention includes the topography simulator. Accordingly, according to a wafer opening ratio and a mask structure, such as a solid angle of a local pattern, an amount of deposition species incident upon a target (material to be etched) sidewall to be processed, which is presumed to affect the dimension transfer difference $\Delta CD$, i.e., a product of an etching reaction product flux depending on the wafer opening ratio and a solid angle of a local pattern is estimated, automatically calculating an optimum process parameter for achieving a desired critical dimension.

The process parameter thus estimated and calculated can be fed in real time back to the etching chamber through the control section in the dry etching equipment, thereby making it possible to automatically control the dimension with accuracy.

In accordance with another embodiment of the present invention, there is provided a method for producing a semiconductor device including the steps of: forming an etching mask on a material to be etched, and then etching the material to be etched using a dry etching equipment to form a local patter. The dry etching equipment includes a topography simulator and a control section. The topography simulator controls an amount of deposition species incident upon a sidewall to be processed in accordance with a wafer opening ration and a solid angel of a local pattern, wherein the amount of deposition species is represented by a product of a reaction product flux and the solid angle. The controls section compares a database obtained by the topography simulator with an actual measured value detected from an etching condition during dry etching to calculate a correction value for etching process, and indicates the correction value to an etching chamber in the dry etching equipment. The dry etching equipment corrects in real time a parameter for the etching process conducted in the etching chamber.

In the method for producing a semiconductor device according to an embodiment of the present invention, the dry etching equipment by using an embodiment of the present invention is used in etching, and therefore etching with a variation on the nanometer scale in the critical dimension (CD) is achieved, thus making it possible to form a pattern with accuracy.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

FIG. 2 is an image showing a graphical user interface (GUI) of a simulator.

FIG. 4 is a flowchart showing an algorithm of a topography simulator in the first embodiment.

DETAILED DESCRIPTION OF EMBODIMENTS

A dry etching according to an embodiment (an embodiment regarding to an equipment) of the present invention will be described with reference to the block diagram of FIG. 1 and the image of FIG. 2 showing a graphical user interface (GUI) of a simulator.

Figure 1:
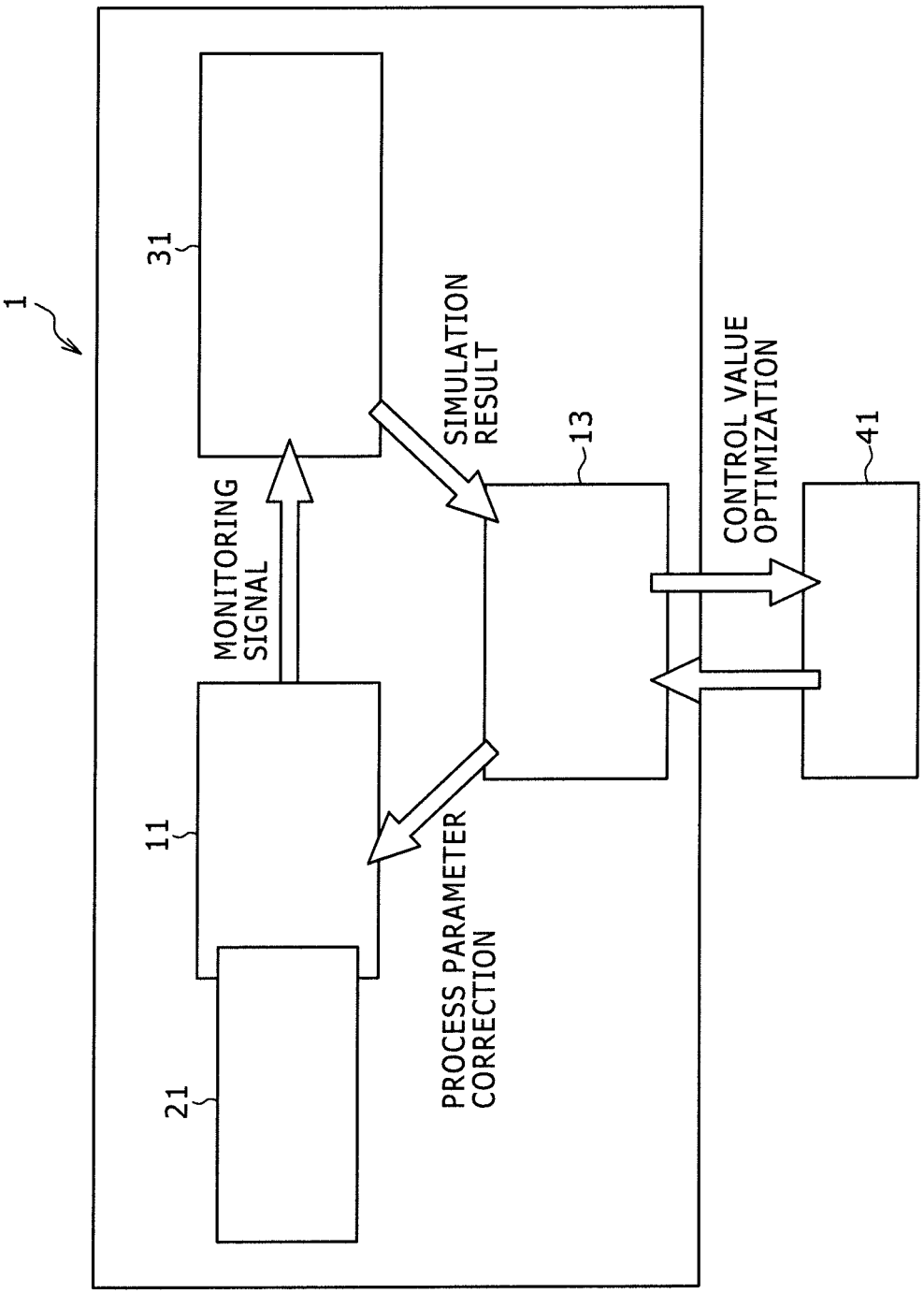
FIG. 1 is a block diagram showing a dry etching according to an embodiment (an embodiment regarding to an equipment) of the present invention.

As shown in FIG. 1, a dry etching equipment 1 is a capacitive coupled plasma (CCP) dry etching equipment which enables plasma etching. The dry etching equipment 1 may be a parallel and flat-type dry etching equipment, an inductive coupled plasma (ICP) dry etching equipment, or an electron cyclotron resonance (ECR) dry etching equipment.

The dry etching equipment 1 includes an etching chamber 11, a power supply for generating plasma within the etching chamber 11, and a control section 13 for transmitting a control signal, which controls the plasma generated within the etching chamber 11, to the power supply.

The dry etching equipment 1 further includes a monitor 21 for monitoring plasma conditions in the etching chamber 11 required for process correction (for example, electron density, electron temperature, light emission intensity, radical or ion species, and ion energy) during etching.

The monitor 21 includes a probe for measuring, for example, plasma conditions within the etching chamber 11 required for process correction, e.g., a plasma density. With respect to the probe, a Langmuir probe may be used.

In addition, the monitor includes a mass spectrometer for measuring radical or ion species in the etching atmosphere. With respect to the mass spectrometer, a quadrupole mass spectrometer (QMS) may be used.

An optical emission spectrometer (OES) is installed so as to measure a light emission intensity of radical or ion.

Further, an ion energy spectrum analyzer is installed so as to measure acceleration energy of ion in the sheath region of plasma.

The plasma conditions (electron density, electron temperature, light emission intensity, and ion energy) are monitored during etching.

The dry etching equipment 1 includes a topography simulator 31 for controlling an amount of deposition with consideration given to both a wafer opening ratio and a solid angle of a local pattern. The amount of deposition is represented by a product of an etching reaction product flux immediately above a pattern (depending on the wafer opening ratio) and a solid angle of a local pattern.

The topography simulator 31 is not necessarily installed directly on the dry etching equipment, and may be connected to the dry etching equipment 1 through, for example, a network. Examples of networks include LAN, such as serial and Ethernet.

The topography simulator 31 calculates a correction value for correcting the etching conditions for the plasma etching, by varying physical values and the like relating to the plasma etching, which create a database, and making correspond to a value in the database with data actually measured with the monitor 21. The topography simulator sends the calculated correction value to the control section 13, and the control section 13 corrects the energy conditions on the basis of the correction value. For example, the control section changes the plasma conditions in the etching chamber 11.

With respect to the platform for executing the topography simulator 31, various OSs can be used, and examples include Windows (registered trademark)/Cygwin OS, Mac OS X, LINUX, and UNIX (registered trademark) OS.

With respect to the simulator engine for the topography simulator 31, various program languages can be used, and, for example, a program language, such as Fortran 77/90/95, C, C++, or JAVA (registered trademark), can be used.

To the control section 13, an FDC (fault detection and classification) section 41 for optimizing the control value (threshold) is further connected. The FDC section 41 automatically optimizes, for example, an etching rate control value (threshold) in real time for each process of each device.

The result of the above simulation is displayed in real time during etching on a screen (graphical user interface (GUI) of the simulator) as shown in FIG. 2, and etching can be made while checking the expected etching topography.

With respect to the etching by using the dry etching equipment 1 for various devices presumed to be produced, the topography simulation according to the algorithm of the topography simulator 31 in the first embodiment is described below with reference to FIG. 3.

Prior to the etching, a database for the topography simulator 31 is preliminarily prepared. The data shown below are merely an example and can be changed if desired.

Specifically, conditions are as follows.

With respect to the film thickness:
Photoresist film thickness: 100 to 600 nm
Antireflection coating film thickness: 50 to 100 nm
Silicon film thickness: 40 to 300 nm
Photoresist width: 50 to 200 nm
With respect to the plasma conditions:
Plasma density: $10^9$ cm$^{-2}$ to $10^{12}$ cm$^{-3}$
Electron temperature: 0.5 to 7 eV
Ion flux: $10^9$ to $10^{17}$ cm$^{-2}$
Radical flux: $10^9$ to $10^{20}$ cm$^{-2}$
Ion energy: 10 to 1,000 eV
With respect to the process parameter:
Pressure: 0.13 to 67 Pa
Gas type: hydrogen bromide gas (HBr), oxygen gas (O$_2$), chlorine gas (Cl$_2$)
Flow rate: 0.13 to 267 Pa
Power: 0 to 2,000 W
Lower electrode temperature: 10 to 100° C.
With respect to the wafer data:
Opening ratio: 0 to 100%

Under the above conditions, a calculation for the local pattern structure is made, and a database (e.g., digital database) relating to critical dimension transfer difference ΔCD, taper angle, and etching rate value is prepared as a database for the topography simulator 31.

Hereinbelow, an example of topography simulation in the topography simulator 31 will be described.

An outline of the algorithm in the topography simulator 31 is described with reference to the block diagram of FIG. 3.

Figure 3:
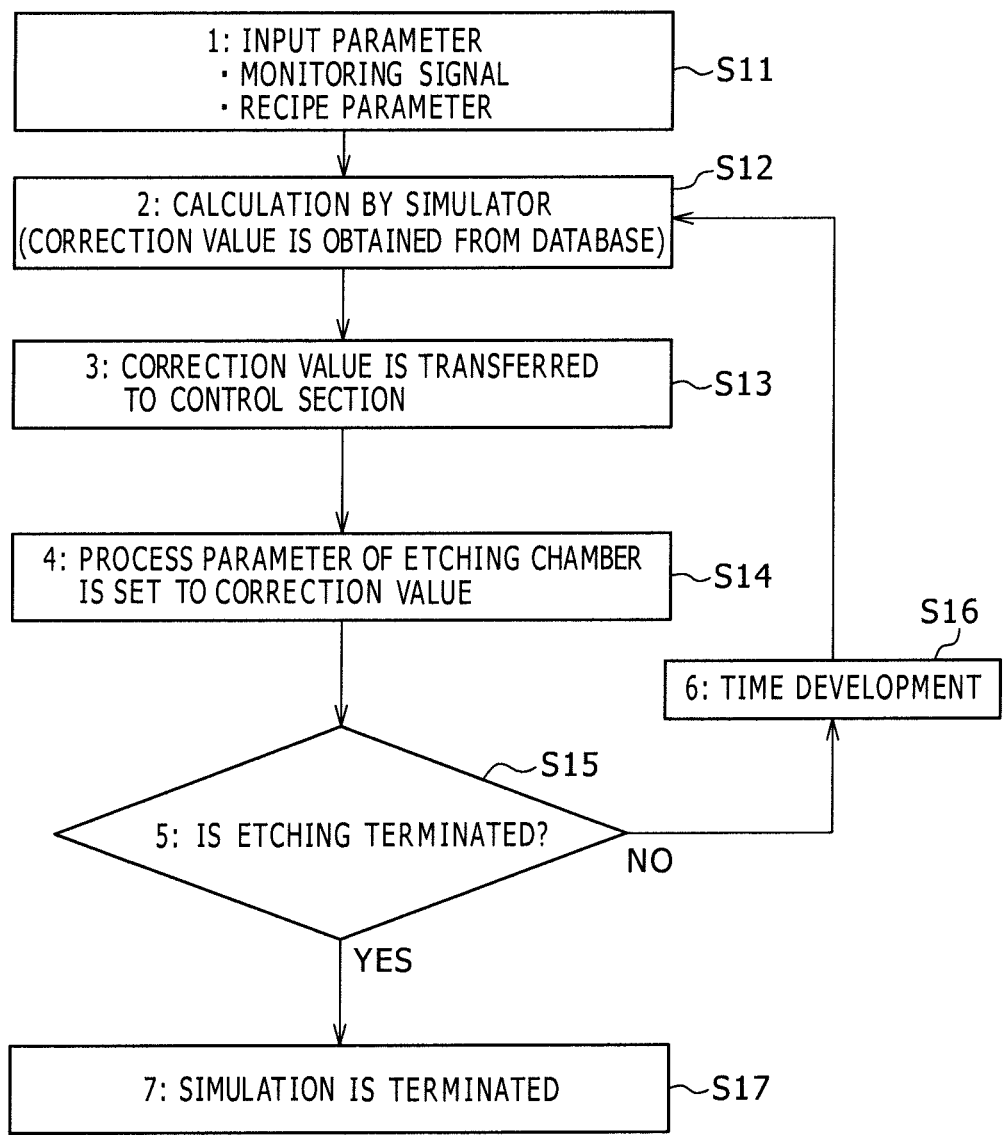
FIG. 3 is a flowchart showing an algorithm of a topography simulator in the first embodiment.

As shown in FIG. 3, the simulation is performed through steps S11 to S17.

At a step S11 of "Input parameter", a process recipe value and a value measured with the monitor 21 are used.

At a step S12 of "Calculation by simulator (Correction value is obtained from database)", a correction value is obtained from the database. This step is described in detail later with reference to FIG. 4.

Next, in a step S13 of "Correction value is transferred to control section", the obtained correction value is transferred to the control section 13. Then, the control section 13 sends a process parameter on the basis of the correction value to the etching chamber 11.

Thereafter, in a step S14 of "Process parameter of etching chamber is set to correction value", the process parameter is set to the correction value sent from the control section 13. Etching is conducted on the basis of the correction value.

The etching is then advanced for a predetermined period of time, and when, in a step S15 of "Is etching terminated?", it is determined whether the etching is allowed to terminate. For example, this step determines whether the etched topography has been reached to a desired topography.

When, in the step S15 of "Is etching terminated?", it is determined that the etching has not been terminated, the process proceeds to a step S16 of "Time development", and, for obtaining a new correction value on the basis of the etching conditions at that point in time, the step S12 of "Calculation by simulator (Correction value is obtained from database)" and subsequent steps are repeated.

On the other hand, when, in the step S15 of "Is etching terminated?", it is determined that the etching has been terminated, the etching is allowed to terminate, and further the process proceeds to a step S17 of "Simulation is terminated", and the simulation is allowed to terminate.

The step S12 of "Calculation by simulator (Correction value is obtained from database)" is described below in detail with reference to FIG. 4.

As shown in FIG. 4, first, in a step S101 of "Check with monitoring signal", for example, on the basis of the temperature data of a lower electrode provided in the etching chamber 11, an optimum value T' meeting a desired critical dimension (CD) is obtained by an interpolation method.

Then, in a step S102 of "Critical dimension (CD) at optimum value T' is determined for tolerance specification", it is determined whether the critical dimension (CD) at the optimum value T' falls within the range of tolerance specification. When the critical dimension (CD) at the optimum value T' falls within the range of tolerance specification, the process proceeds to the step S13 of "Correction value is transferred to control section".

On the other hand, when the critical dimension (CD) at the optimum value T' falls outside of the range of tolerance specification, at the next step S103 of "Check with monitoring signal and optimum value T'", for example, on the basis of the gas pressure data in the etching chamber 11, an optimum value P' meeting a desired critical dimension (CD) is obtained by an interpolation method.

Then, in a step S104 of "Critical dimension (CD) at optimum value P' is determined for tolerance specification", it is determined whether the critical dimension (CD) at the optimum value P' falls within the range of tolerance specification. When the critical dimension (CD) at the optimum value P' falls within the range of tolerance specification, the process proceeds to the step S13 of "Correction value is transferred to control section".

On the other hand, when the critical dimension (CD) at the optimum value P' falls outside of the range of tolerance specification, at the next step S105 of "Check with monitoring signal, optimum value T', and optimum value P'", for example, on the basis of the lower bias power data in the etching chamber 11, an optimum value Wb' meeting a desired critical dimension (CD) is obtained by an interpolation method.

Then, in a step S106 of "Critical dimension (CD) at optimum value Wb', it is determined for tolerance specification" determined whether the critical dimension (CD) at the optimum value Wb' falls within the range of tolerance specification. When the critical dimension (CD) at the optimum value Wb' falls within the range of tolerance specification, the process proceeds to the step S13 of "Correction value is transferred to control section".

On the other hand, when the critical dimension (CD) at the optimum value Wb' falls outside of the range of tolerance specification, in the next step S107 of "Check with monitoring signal, optimum value T', optimum value P', and optimum value Wb'", for example, on the basis of the top bias power data in the etching chamber 11, an optimum value Wt' meeting a desired critical dimension (CD) is obtained by an interpolation method.

Then, in a step S108 of "Critical dimension (CD) at optimum value Wt', it is determined for tolerance specification" determines whether the critical dimension (CD) at the optimum value Wt' falls within the range of tolerance specification. When the critical dimension (CD) at the optimum value Wt' falls within the range of tolerance specification, the process proceeds to the step S13 of "Correction value is transferred to control section".

On the other hand, when the critical dimension (CD) at the optimum value Wt' falls outside of the range of tolerance specification, in the next step S109 of "Error signal is transmitted to FDC section", an error signal is transmitted to, for example, the FDC section 41.

The dry etching equipment 1 according to an embodiment of the present invention includes the topography simulator 31 for controlling an amount of deposition species incident upon a sidewall to be processed in accordance with a wafer opening ratio and a solid angle of a local pattern wherein the amount of deposition is represented by a product of a reaction product flux and the solid angle. Consequently, according to a wafer opening ratio and a mask structure, such as a solid angle of a local pattern, an amount of deposition species incident upon a target (material to be etched) sidewall to be processed, which is presumed to affect the dimension transfer difference $\Delta CD$, i.e., a product of an etching reaction product flux depending on the wafer opening ratio and a solid angle of a local pattern is estimated, automatically calculating an optimum process parameter for achieving a desired critical dimension.

The process parameter thus estimated and calculated can be fed in real time back to the etching chamber 11 through the control section 13 in the dry etching equipment 1, thereby making it possible to automatically control the dimension with accuracy.

Further, in the simulation, a topography model developing with time is used, and therefore a solid angle of a target pattern (pattern to be etched) changing momentarily during etching can be calculated, thereby estimating and correcting the amount of deposition species incident upon the etched surface from the calculated solid angle.

By using, as an input parameter for the model, a plasma monitoring signal obtained by a Langmuir probe, a QMS, an OES, or an ion energy spectrum analyzer in the monitor 21, a calculation reflecting the actual conditions in the etching chamber 11 (e.g., a change of the plasma formulation (ion, radical, and reaction product) caused due to the change of wafer opening ratio, or a change of the state of the chamber wall during etching) can be made in real time, thereby achieving control of the critical dimension with high accuracy on a scale of the atom or molecule size.

Thus, the process parameter can be corrected in real time during etching, thereby enabling automatic control of the critical dimension with no variation in the wafer plane or between the wafers or lots.

Next, in the case of conducing an etching by using the dry etching equipment 1, while presuming various devices to be produced, the topography simulation according to the algorithm of the topography simulator 31 in the second embodiment is described below with reference to FIG. 5.

In the second embodiment, a computer allowing high-speed processing is used. For example, a computer which can achieve one or more correction feedbacks in a real time of 2 seconds is installed in or connected to the dry etching equipment 1 through a network (LAN using serial, Ethernet, or the like) so that they can communicate with each other. Topography simulation according to the algorithm in the first embodiment is performed in real time during etching. Therefore, unlike the first embodiment, there is no need to preliminarily prepare a digital database in the present second embodiment.

With respect to the light-emission data of plasma and the ion energy of plasma, as in the case of the first embodiment, values actually measured with the monitor 21 installed in the dry etching equipment 1 are used.

Accordingly, as the optimum process parameters concerning the real time control of the deposition amount for achieving a desired critical dimension (CD), for example, a gas pressure (or flow rate), a power, a lower electrode temperature, and the like are estimated and calculated, and the parameters for the etching chamber 11 can be corrected through the control section 13.

Prior to the etching, recipe parameters are preliminarily inputted into the topography simulator 31.

Specifically, conditions are as follows.

With respect to the film thickness:
Photoresist film thickness: 100 to 600 nm
Antireflection coating film thickness: 50 to 100 nm
Silicon film thickness: 40 to 300 nm
Photoresist width: 50 to 200 nm
With respect to the plasma conditions:
Plasma density: $10^9$ cm$^{-2}$ to $10^{12}$ cm$^{-3}$
Electron temperature: 0.5 to 7 eV
Ion flux: $10^9$ to $10^{17}$ cm$^{-2}$
Radical flux: $10^9$ to $10^2$° cm$^{-2}$
Ion energy: 10 to 1,000 eV
With respect to the process parameter:
Pressure: 0.13 to 67 Pa
Gas type: hydrogen bromide gas (HBr), oxygen gas ($O_2$), chlorine gas ($Cl_2$)
Flow rate: 0.13 to 267 Pa
Power: 0 to 2,000 W
Lower electrode temperature: 10 to 100° C.
With respect to the wafer data:
Opening ratio: 0 to 100%

Hereinbelow, an example of topography simulation in the topography simulator 31 will be described.

An outline of the algorithm in the topography simulator 31 is described with reference to the block diagram of FIG. 5.

Figure 5:
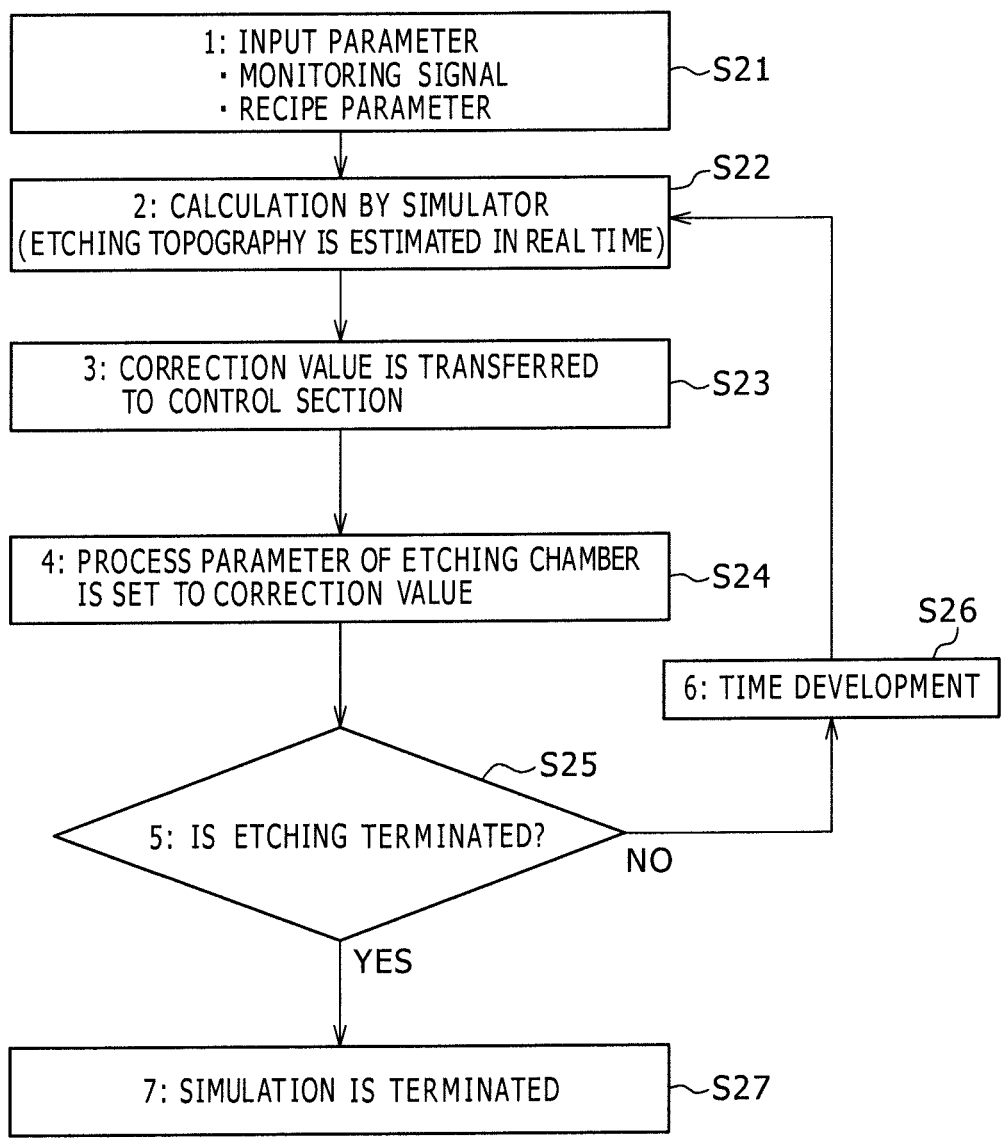
FIG. 5 is a flowchart showing an algorithm of a topography simulator in the second embodiment.

As shown in FIG. 5, the simulation is performed through steps S21 to S27.

At a step S21 of "Input parameter", a process recipe value and a value measured with the monitor 21 are used.

At a step S22 of "Calculation by simulator (Etching topography is estimated in real time)", a correction value is obtained on the basis of the actual measured value obtained from the monitor 21 and the process recipe value. This step is described in detail later with reference to FIG. 6.

Next, in a step S23 of "Correction value is transferred to control section", the correction value obtained is transferred to the control section 13. Then, the control section 13 sends a process parameter on the basis of the correction value to the etching chamber 11.

Then, in a step S24 of "Process parameter of etching chamber is set to correction value", the process parameter is set to the correction value sent from the control section 13. Then, etching is conducted on the basis of the correction value.

The etching is then advanced for a predetermined period of time, and in a step S25 of "Is etching terminated?", it is determined whether the etching is allowed to terminate. For example, this step determines whether the etching topography has been reached to a desired topography.

When, in the step S25 of "Is etching terminated?", it is determined that the etching has not been terminated, in a step S26 of "Time development", on the basis of the etching conditions at that point in time, for obtaining a new correction value, the step S22 of "Calculation by simulator (Etching topography is estimated in real time)" and subsequent steps are repeated.

On the other hand, when, in the step S25 of "Is etching terminated?", it is determined that the etching has been terminated, the etching is allowed to terminate, and further the process proceeds to a step S27 of "Simulation is terminated", which terminates the simulation.

The step S22 of "Calculation by simulator (Etching topography is estimated in real time)" is described below in detail with reference to the block diagram of FIG. 6.

Figure 6:
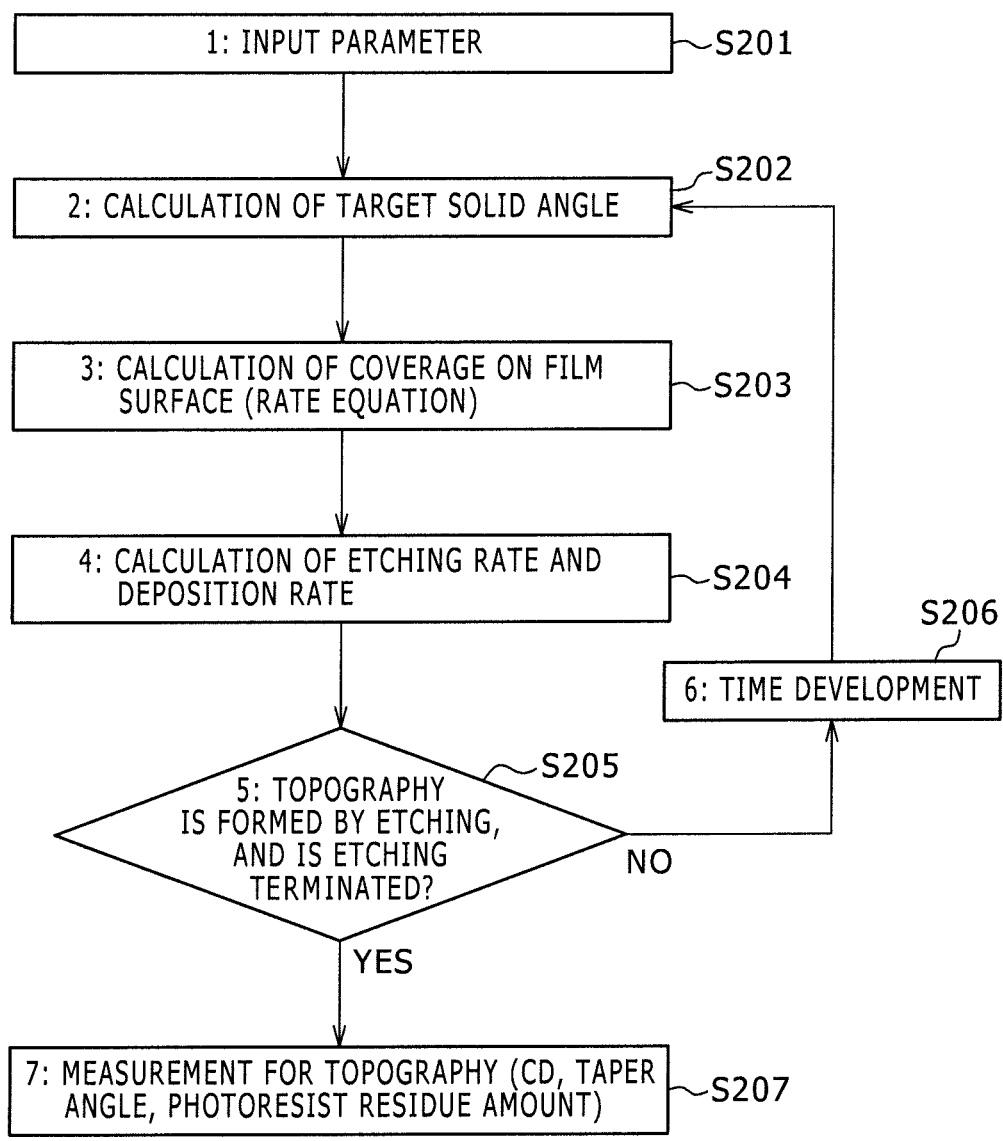
FIG. 6 is a flowchart showing an algorithm of a topography simulator in the second embodiment.

As shown in FIG. 6, the simulation is performed through steps S201 to S207.

At a step S201 of "Input parameter" (similar to the step S21 of "Input parameter"), as described above, a process recipe value and a value measured with the measuring machine described above are used.

In a step S202 of "Calculation of target solid angle", a target solid angle is calculated. Specifically, by using data for a local pattern (e.g., a pattern in a 2 µm radius around a target as a center) and an etching rate, a calculation is conducted in real time for each step (0.1 second). With respect to the transistor gate having a multilayer film structure including films each having the following thickness: photoresist/antireflection coating film/silicon film/gate oxide film=250 nm/80 nm/50 nm/3 nm, and a 2 µm periphery around the transistor gate, an effective solid angle S' is calculated by the formulae (1) and (2) below.

Figure 7A:
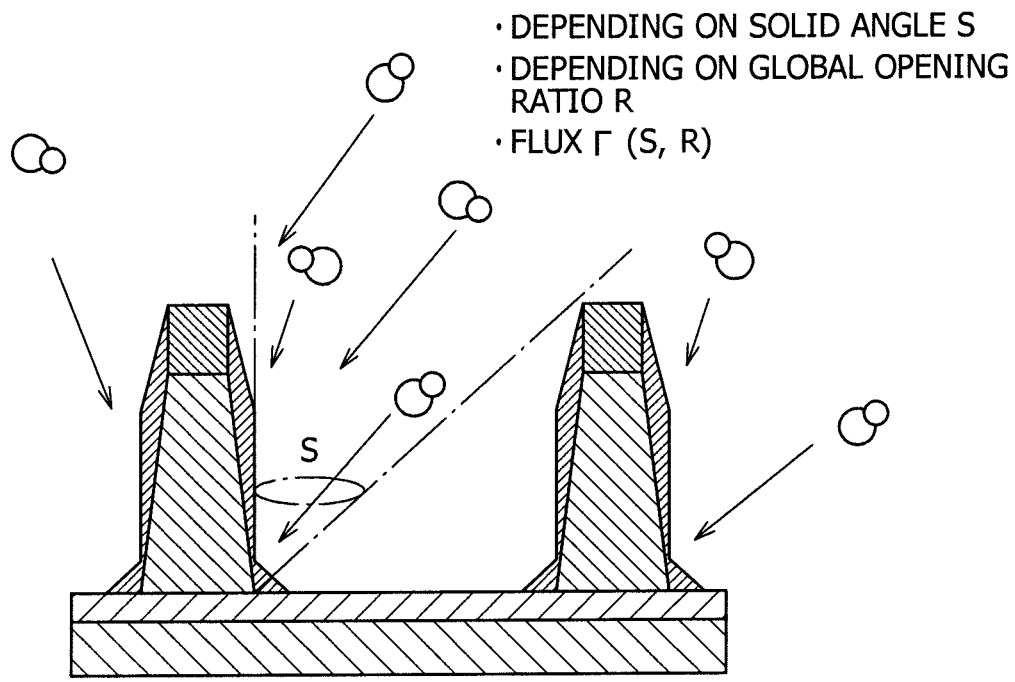
FIGS. 7A and 7B are diagrammatic views explaining a solid angle.
Figure 7B:
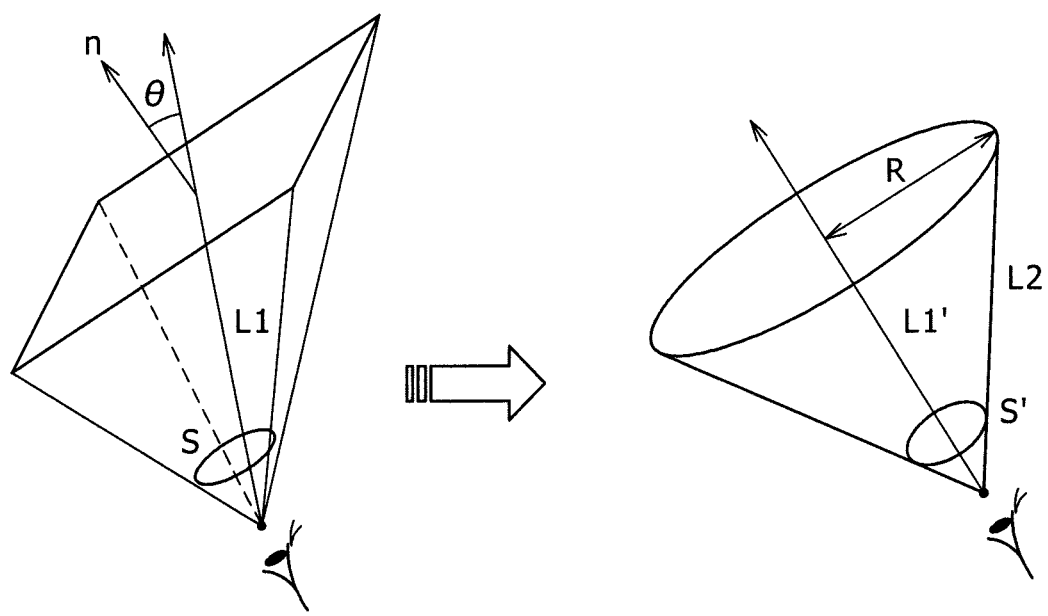

As seen from FIGS. 7A and 7B, in the formulae (1) to (3) below, S represents a solid angle as viewed from a reference point, R in FIG. 7A represents a global opening ratio, L1 represents a distance between the reference point and the center of the bottom of a pyramid formed from the reference point with the solid angle S, θ represents an angle between a line linking the reference point and the center of the bottom of a pyramid formed from the reference point with the solid angle S and a normal to the bottom, L1' represents a distance of the normal from the reference point to the bottom of a cone formed from the reference point with an effective solid angle S', L2 represents a distance from the reference point to the outer edge of the bottom of the cone, and R in FIG. 7B represents a radius of the bottom of the cone.

$$S' = 2\pi(1 - \cos\phi) \quad (1)$$

$$\cos\phi = \frac{L1'}{L2} = \frac{L1 \times \cos\theta}{(R2 + L1'^2)^{0.5}} \quad (2)$$

In the second embodiment, the initial effective solid angle S' concerning the target pattern is 2.3 sr.

The application of the solid angle is limited to this pattern, and the solid angle may be applied to various types of local structures, multilayer films, and film thicknesses.

Using the calculated effective solid angle S' and the data flux amount (Γ) obtained by monitoring the plasma with the monitor 21, an amount of deposition species (Γd) incident upon the target sidewall to be processed is calculated by the following formula (3).

$$\Gamma d = \Gamma \times S'/2\pi \quad (3)$$

In a step S203 of "Calculation of coverage on film surface (Rate equation)", a reaction in the etching surface layer is set, and rate equations represented by the formulae (4), (5), and (6) below are solved by using the deposition amount Γd.

In the formulae (4) to (8) below, φ represents a coverage, S represents an adsorption probability, Y represents an etch yield, and ρ represents a density.

$$\sigma_s \frac{d\phi_n}{dt} = \\ S_{n0}\Gamma_n(1 - \phi_n - \phi_o - \phi_p) - Y_{tot}\Gamma_i\phi_n - S_{o0}\Gamma_o\phi_n - (S_{p0}\Gamma_p + S_{q0}\Gamma_q)\times\phi_n \quad (4)$$

$$\sigma_s \frac{d\phi_o}{dt} = S_{o0}\Gamma_o(1 - \phi_o - \phi_p) - Y_{so}\Gamma_i\phi_o - (S_{p0}\Gamma_p + S_{q0}\Gamma_q)\times\phi_o \quad (5)$$

-continued $$\sigma_s \frac{d\phi_p}{dt} = [(S_{p0}\Gamma_p + S_{q0}\Gamma_q)] \times (1 - \phi_p) - Y_p\Gamma_i\phi_p \qquad (6)$$

Thus, in a step S204 of "Calculation of etching rate and deposition rate", an etching rate ER represented by the formula (7) below and a deposition rate DR represented by the formula (8) below are calculated.

Figure 8:
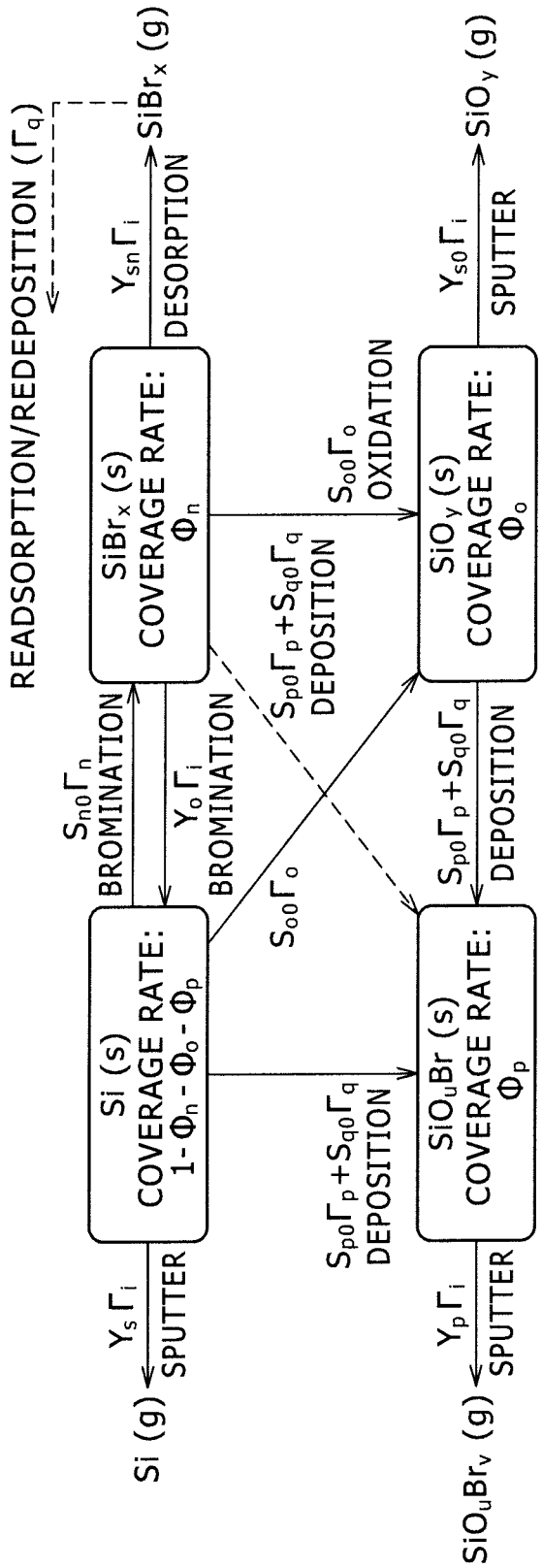
FIG. 8 is a reaction diagram showing an example of reaction in the etching surface layer.

A reaction in the etching surface layer is, as shown in FIG. 8, an etching reaction in a system of, for example, hydrogen bromide gas (HBr)/oxygen gas ($O_2$). In a system of halogen, such as chlorine gas ($Cl_2$), a similar reaction scheme is achieved. In the deposition amount Γd, a bromide reaction product, such as $SiBr_x$ or $SiO_xBr_y$, is formed.

$$ER = \Gamma i[Y_{sn}\Phi_n + Y_{so}\Phi_o + Y_s(1-\Phi_n-\Phi_o-\Phi_p)]/\rho s \qquad (7)$$

$$DR = [S_{p0}\Gamma_p + S_{q0}\Gamma_q) + S_{q2}\Gamma_{q2} - Y_p\Gamma i\Phi_p]/\rho s \qquad (8)$$

Using the etching rate ER and deposition rate DR, the progress of etching topography is made, for example, by employing a String method which consumes less memory of a computer. Another topography progress method, such as a Cell method or a level set method, may be used. The gas system used is not limited to the HBr/$O_2$ gas system. When the reaction scheme on the etching surface is known, various etching gas systems can be used.

The device data and initial values for the process conditions actually used in the etching are shown below.

A wafer opening ratio is 70%, and a solid angle is 2.3 sr.

Etching conditions for the anti-reflection coating film are as follows.
Chlorine gas ($Cl_2$): 20 cm$^3$/min
Oxygen gas ($O_2$): 20 cm$^3$/min
Source power: 200 W
Bias power: 70 W
Pressure: 2.7 Pa
Lower electrode temperature: 55° C.

Etching conditions and over etching conditions for the silicon (etching time: 25 sec) are as follows.
Hydrogen bromide gas (HBr): 150 cm$^3$/min
Oxygen gas ($O_2$): 2 cm$^3$/min
Source power: 200 W
Bias power: 100 W
Pressure: 2.0 Pa
Lower electrode temperature: 55° C.

Using the monitor 21 installed in the etching equipment {e.g., a Langmuir probe, a quadrupole mass spectrometer (QMS), an optical emission spectrometer (OES), or an ion energy analyzer}, a plasma monitoring signal in the actual etching (e.g., plasma density: up to $5 \times 10^9$ cm$^{-3}$, electron temperature: up to 3 eV, light-emission intensity (e.g., light-emission intensity in a wavelength range of 200 to 800 nm), or ion energy: 0 to 200 eV) and the database are compared on an as needed basis, and the data is subjected to three-dimensional spline interpolation, thereby automatically detecting an optimum process parameter achieving a desired dimension (e.g., a gas pressure or flow rate, a power, or a lower electrode temperature). The interpolation and detection are performed in the order of from a parameter which is presumed to cause the deposition amount to more remarkably affect the critical dimension difference ΔCD, specifically, in the order of lower electrode temperature, gas pressure, bias power, and top power.

Then, in a step S205 of "Topography is formed by etching, and is etching terminated?", it is determined whether a desired etched topography is obtained.

When the desired etched topography is obtained, the etching is terminated.

On the other hand, when the desired etched topography is not obtained, the process proceeds to a step S206 of "Time development", and, for example, based on parameters thus automatically detected and corrected, the etching chamber 11 is subjected to a feedback in real time through the control section 13.

The amount of deposition species incident upon a target is controlled to suppress a variation of the desired critical dimension (CD) in the wafer plane or between the wafers or lots.

Thus, the initial parameters are corrected so that the gas pressure finally is 2.0 to 3.3 Pa, the lower electrode temperature is 50 to 70° C., the bias power is 90 to 120 W, and the top power is 170 to 250 W. Based on these correction values, the etching is proceeded by being subjected to the feedback.

The etching is terminated, and then, in a step S207 of "Measurement for topography", a critical dimension (CD), a taper angle, a photoresist residue amount, and the like are measured.

As a result, a desired transfer difference ΔCD of −20±3 nm and a taper angle of 86±2° can be achieved.

In the second embodiment, the same effect as that in the first embodiment is obtained.

Specifically, the simulation uses a topography model developing with time, and therefore a solid angle of a target pattern (pattern to be etched) changing momentarily during etching can be calculated, thereby estimating and correcting an amount of deposition species incident upon the etched surface from the calculated solid angle.

By using, as an input parameter for the model, a plasma monitoring signal obtained by a Langmuir probe, a QMS, an OES, or an ion energy spectrum analyzer in the monitor 21, a calculation reflecting the actual conditions in the etching chamber 11 (for example, a change of the plasma formulation (ion, radical, and reaction product) caused due to the change of wafer opening ratio, or a change of the state of the chamber wall during etching) can be made in real time, thereby achieving control of the critical dimension with high accuracy on a scale of the atom or molecule size.

Thus, the process parameter can be corrected in real time during etching, thereby enabling automatic control of the critical dimension with stability in the wafer plane or between the wafers or lots.

Next, in the case of conducting the etching by using the dry etching equipment 1, while presuming various devices to be produced, the topography simulation according to the algorithm of the topography simulator 31 in the third embodiment is described below with reference to FIGS. 11 and 12.

Figure 9A:
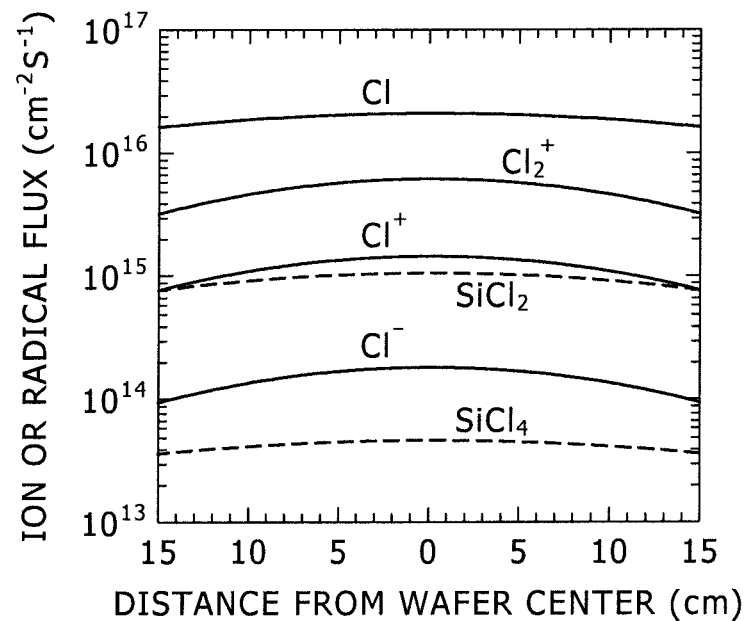
FIGS. 9A and 9B are diagrams for flux distribution and a diagram for a change of flux with time.
Figure 9B:
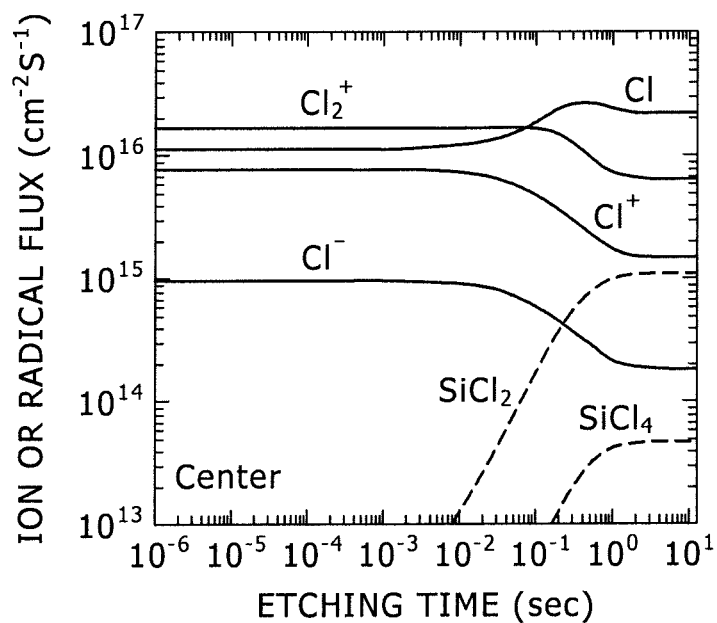
Figure 10A:
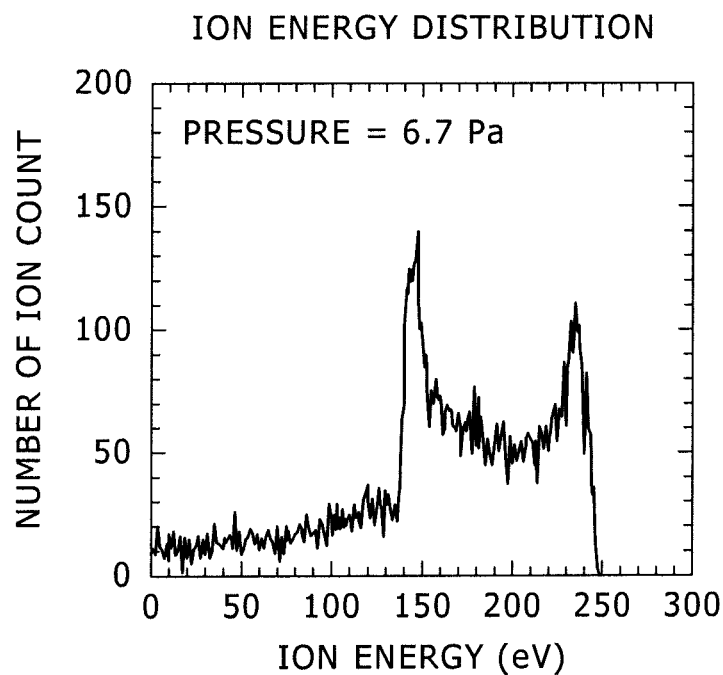
FIGS. 10A and 10B are diagrams for ion energy distribution and a diagram for incident angle distribution.
Figure 10B:
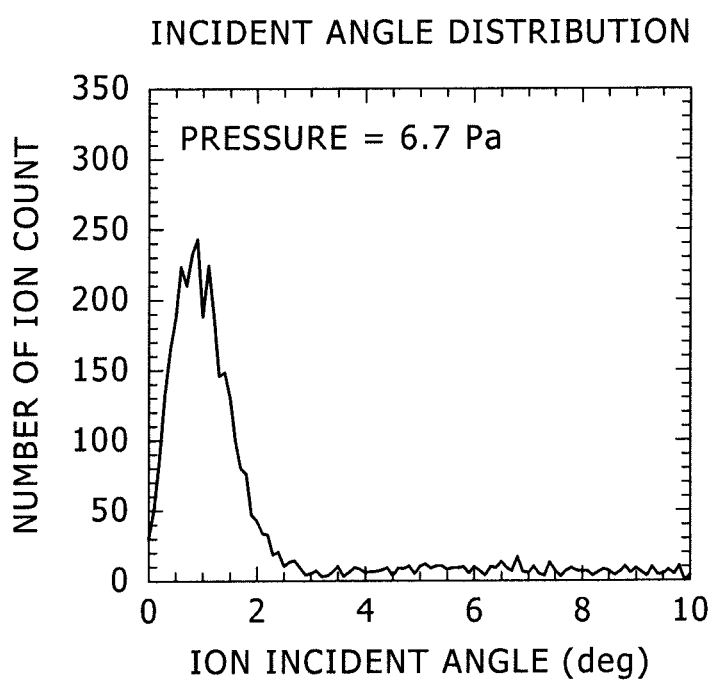

In the third embodiment, without using a plasma monitoring signal of the monitor 21 in the dry etching equipment 1 (plasma emission intensity or ion energy), a plasma vapor phase module (an example of the results of calculation for the distribution of flux and the change of flux with time is shown in FIGS. 9A and 9B) and a collisional sheath module (an example of the results of calculation for the distribution of ion energy and the distribution of ion incident angle is shown in FIGS. 10A and 10B) are linked to the topography simulator 31, and the whole phenomenon from the vapor phase to the surface is modeled to estimate a critical dimension (CD), thereby correcting a process parameter, such as a gas pressure or flow rate, a power, or a lower electrode temperature.

The input parameter corresponds to a process recipe value, and, the parameter is changed at the time of correcting the value, for example, in the range of ±50% to detect an optimum parameter. The range of changing can be appropriately selected.

For improving the accuracy, data actually measured for the plasma and topography is preliminarily obtained as a reference to make calibration of a model calculated value. For reducing the calculation load, this is preferably used mainly off-line.

An outline of the algorithm in the topography simulator 31 is described below with reference to the block diagram of FIG. 11. In FIG. 11, an example of the on-line algorithm is shown.

Figure 11:
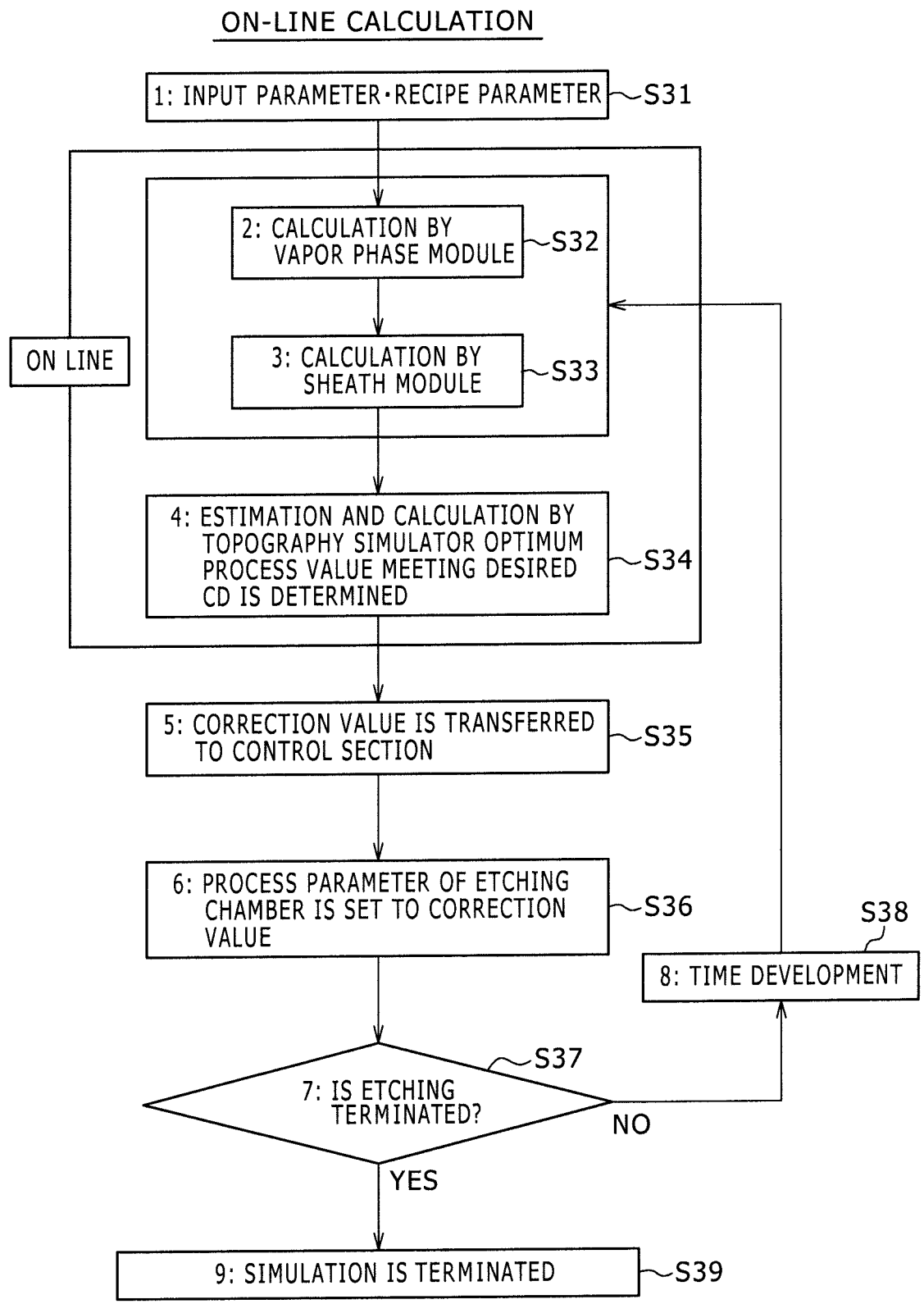
FIG. 11 is a flowchart showing an algorithm of a topography simulator in the third embodiment (on line).

As shown in FIG. 11, the simulation is performed through steps S31 to S39.

At a step S31 of "Input parameter", a process recipe value is inputted.

In a step S32 of "Calculation by vapor phase module", a radical or ion amount changing with time in a vapor phase is estimated and calculated.

In a step S33 of "Calculation by sheath module", energy distribution and incident angle distribution of the ions affected by bombardment in a sheath are estimated and calculated.

Next, in a step S34 of "Estimation and calculation by topography simulator", an optimum process value meeting a desired critical dimension (CD) is determined. This step is described above in detail with reference to FIG. 6, and the description of this is omitted.

The steps S32 through S34 proceed on-line.

Then, in a step S35 of "Correction value is transferred to control section", the correction value obtained is transferred to the control section 13. Thereafter, the control section 13 sends a process parameter on the basis of the correction value to the etching chamber 11.

Then, in a step S36 of "Process parameter of etching chamber is set to correction value", the process parameter is set to the correction value sent from the control section 13. Etching is conducted on the basis of the correction value.

The etching is then conducted for a predetermined period of time, and in a step S37 of "Is etching terminated?", it is determined whether the etching is allowed to terminate. For example, this step determines whether the etched topography has been reached to a desired topography.

When, in the step S37 of "Is etching terminated?", it is determined that the etching has not been terminated, the process proceeds to a step S38 of "Time development", and, for obtaining a new correction value on the basis of the etching conditions at that point in time, the step S32 of "Calculation by vapor phase module", the step S33 of "Calculation by sheath module", and subsequent steps are repeated.

On the other hand, when, in the step S37 of "Is etching terminated?", it is determined that the etching has been completed, the etching is terminated, and further the process proceeds to a step S39 of "Simulation is terminated", which terminates the simulation.

Next, an outline of the off-line algorithm in the topography simulator 31 is described with reference to the block diagram of FIG. 12.

Figure 12:
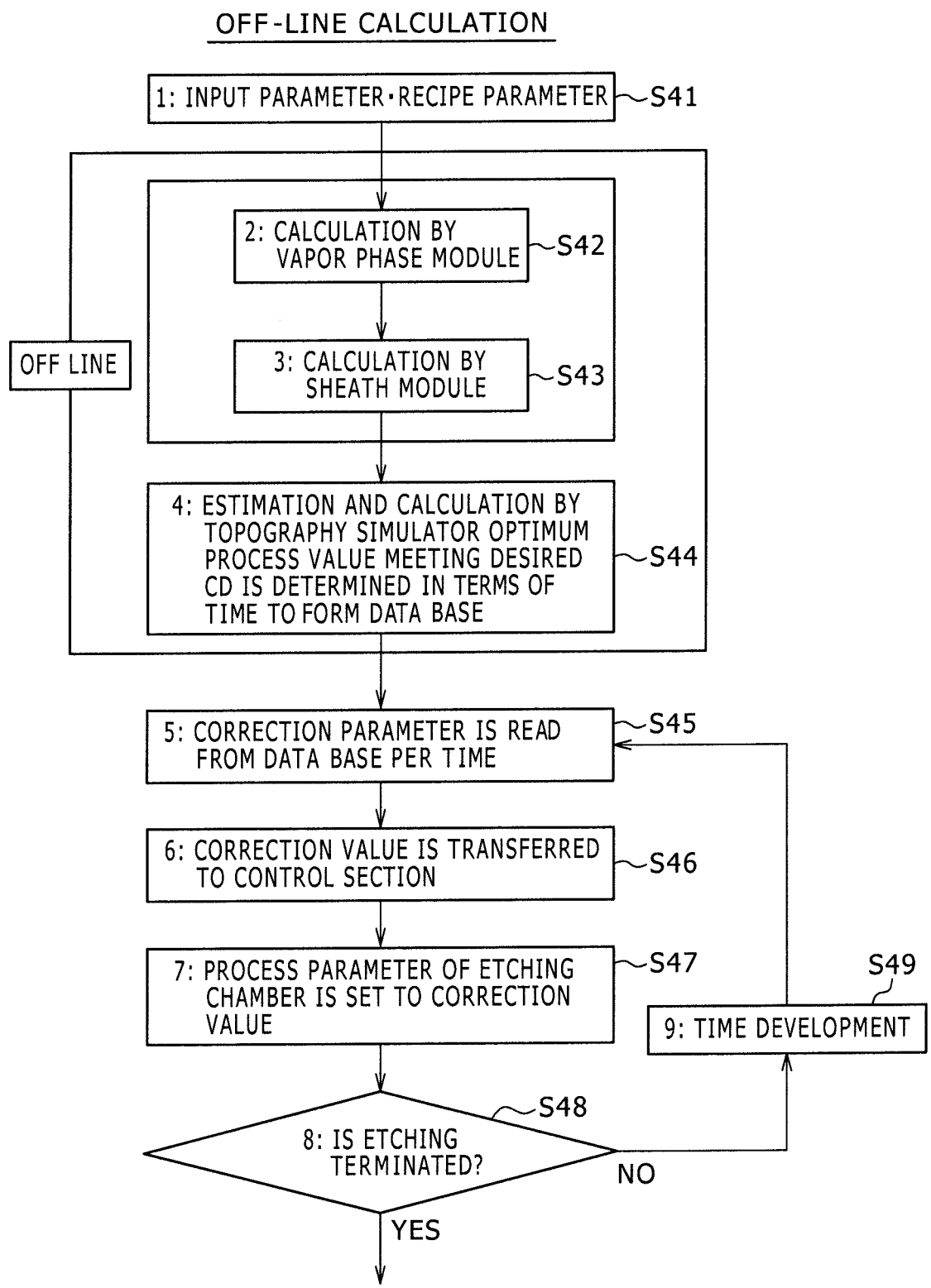
FIG. 12 is a flowchart showing an algorithm of a topography simulator in the third embodiment (off line).

As shown in FIG. 12, the simulation is performed through steps S41 to S49.

At a step S41 of "Input parameter", a process recipe value is inputted.

In a step S42 of "Calculation by vapor phase module", a radical or ion amount changing with time in a vapor phase is estimated and calculated.

Next, in a step S43 of "Calculation by sheath module", energy distribution and incident angle distribution of the ions affected by bombardment in a sheath are estimated and calculated.

Then, in a step S44 of "Estimation and calculation with topography simulator", an optimum process value meeting a desired critical dimension (CD) is determined in terms of a time to create a database. This step of estimation and calculation is described above in detail with reference to FIG. 6, and the description of this is omitted.

The steps S42 through S44 proceed off-line.

Then, in a step S45 of "Correction parameter is read from database", a correction parameter (correction value) is read from the database thus prepared per time.

Then, in a step S46 of "Correction value is transferred to control section", the correction value obtained is transferred to the control section 13. Thereafter, the control section 13 sends a process parameter on the basis of the correction value to the etching chamber 11.

Then, in a step S47 of "Process parameter of etching chamber is set to correction value", the process parameter is set to the correction value on the basis of the correction value sent from the control section 13. Etching is conducted on the basis of the correction value.

The etching is then advanced for a predetermined period of time, and in a step S48 of "Is etching terminated?", it is determined that the etching is terminated. For example, this step determines whether the etched topography has been reached to a desired topography.

When, in the step S48 of "Is etching terminated?", it is determined that the etching has not been terminated, the process proceeds to a step S49 of "Time development", and, for obtaining a new correction value on the basis of the etching conditions at that point in time, the step S42 of "Calculation by vapor phase module", the step S43 of "Calculation by sheath module", and subsequent steps are repeated.

On the other hand, when, in the step S48 of "Is etching terminated?", it is determined that the etching has been terminated, the etching is terminated, and further the simulation is terminated.

In the third embodiment, the same effect as that in the first embodiment is obtained.

Specifically, in the simulation, a topography model developing with time is used, and therefore a solid angle of a target pattern (pattern to be etched) changing momentarily during etching can be calculated, thereby estimating and correcting an amount of deposition species incident upon the etched surface from the calculated solid angle.

By using, as input data for the model, a plasma monitoring signal obtained by a Langmuir probe, a QMS, an OES, or an ion energy spectrum analyzer in the monitor 21, a calculation reflecting the actual conditions in the etching chamber 11 (e.g., a change of the plasma formulation (ion, radical, and reaction product) caused due to the change of wafer opening ratio, or a change of the state of the chamber wall during etching) can be made in real time, thereby achieving control of the critical dimension with high accuracy on a scale of the atom or molecule size.

The process parameter can be corrected in real time during etching, thereby enabling automatic control of the critical dimension with stability in the wafer plane or between the wafers or lots.

Figure 13:
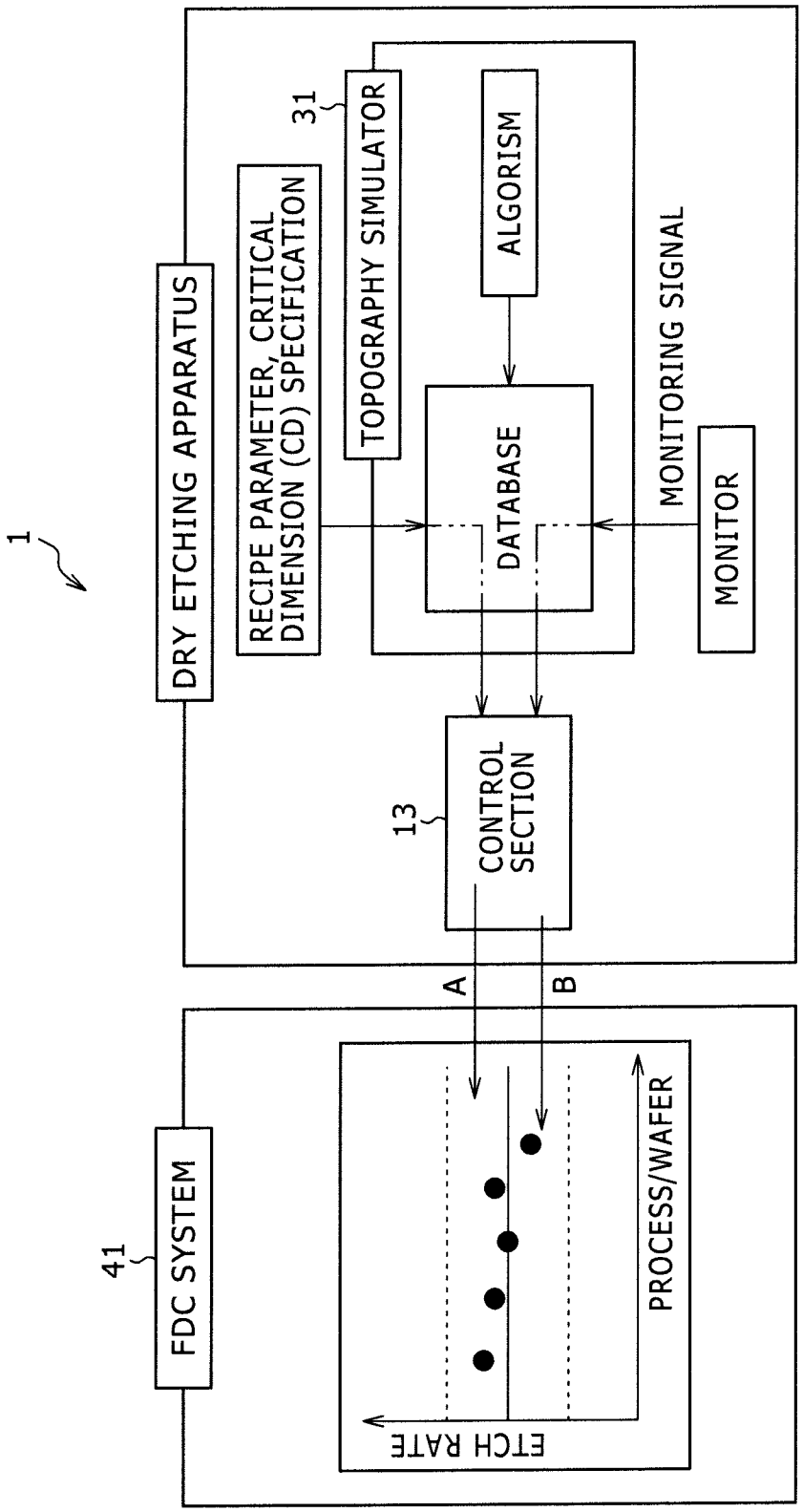
FIG. 13 is a block diagram explaining an FDC section in the dry etching equipment.
Figure 14:
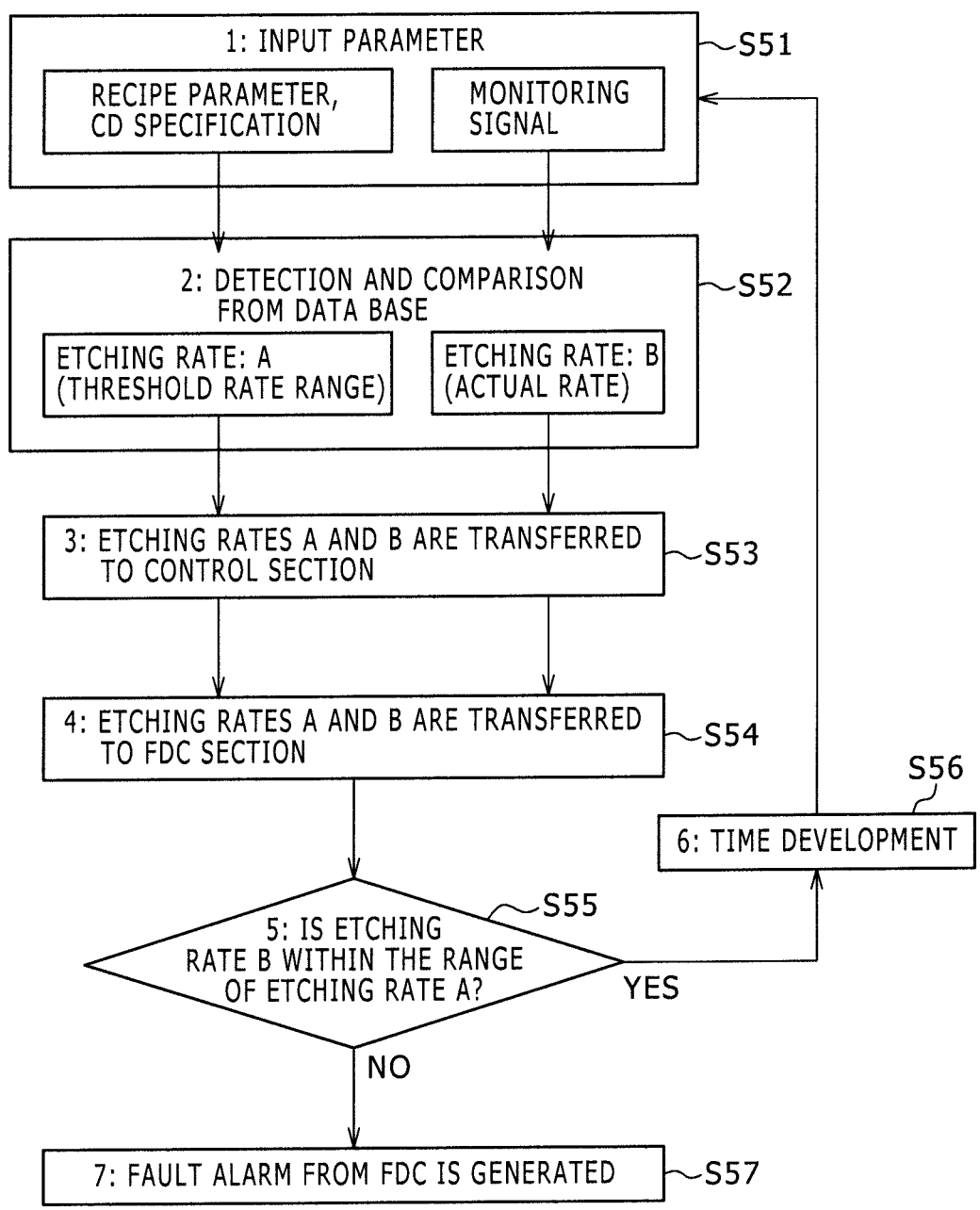
FIG. 14 is a flowchart showing an algorithm of a topography simulator in the fourth embodiment.

In the case of conducting the etching by using the dry etching equipment 1, while presuming various devices to be produced, the topography simulation according to the algorithm of the topography simulator 31 in the fourth embodiment is described below with reference to the block diagram of FIG. 13 and the flowchart of FIG. 14 showing an algorithm.

In the fourth embodiment, as shown in FIG. 13, when starting the etching, a range of etching rate meeting a specification of a desired critical dimension (CD) is founded from the digital database prepared in the first embodiment and the process recipe parameter, and automatically set as a threshold of the etching rate in the FDC section 41 (corresponding to an arrow A shown in FIG. 13).

The range of etching rate meeting a specification of a desired critical dimension (CD) from the digital database and process recipe parameter is founded by a method of the spline interpolation and comparison mentioned in the first embodiment.

On the other hand, from the digital database and the plasma monitoring signal of the dry etching equipment 1, an expected etching rate in each step for the process is calculated in real time according to the simulator algorithm in the first embodiment or second embodiment (corresponding to an arrow B shown in FIG. 13), and compared, on an as needed basis, with the above automatically set FDC threshold during the etching to monitor an etching rate meeting a specification of a desired critical dimension (CD) and detect a fault.

Specifically, as shown in FIG. 14, at a step S51 of "Input parameter", a process recipe parameter and a critical dimension (CD) specification are inputted. In addition, a monitoring signal is obtained from the monitor 21.

In a step S52 of "Comparison and detection from database", a range of etching rate meeting a specification of a desired critical dimension (CD) is founded from the digital database and process recipe parameter. For example, a range of the threshold rate is set as an "Etching rate A". An actual rate is read as an "Etching rate B".

Next, in a step S53 of "Etching rates A and B are transferred to control section", the etching rate A and etching rate B are transferred to the control section 13. Then, the control section 13 sends a process parameter on the basis of the correction value to the etching chamber 11.

Then in a step S54 of "Etching rates A and B are transferred to FDC section", the etching rate A and etching rate B are transferred to the FDC section 41.

Then, in a step S55 of "Is etching rate B within the range of etching rate A?", the FDC section 41 determines whether the etching rate B is within the range of tolerance limits of the etching rate A.

When the FDC section determines that the etching rate B is within the range of tolerance limits of the etching rate A, the process proceeds to a step S56 of "Time development", and, for obtaining a new etching rate on the basis of the etching conditions at that point in time, the step S51 of "Input parameter" and subsequent steps are repeated.

On the other hand, when, in the step S55 of "Is etching rate B within the range of etching rate A?", it is determined that the etching rate B is outside of the range of tolerance limits of the etching rate A, by a step S57 of "Fault alarm from FDC", an etching fault is indicated from the FDC.

In the fourth embodiment, the same effect as that in the first embodiment is obtained. Further, in the simulation in the present embodiment, considering the conditions within the etching chamber 11, an etching rate in each step for the process can be accurately estimated (the deposition amount affecting the etching rate is more accurately controlled). The result of the estimation is fed back in real time to the FDC section, thereby making it possible to automatically and accurately determine in real time an etching rate control value (threshold) meeting a specification of a desired CD and detect a fault.

A major feature of the present invention resides in that the critical dimension (CD) is controlled by the topography simulator taking into consideration an effect of the wafer opening ratio and a change with time of the solid angle of a local pattern and the etching rate control value (threshold) of the FDC system is corrected in real time by using an etching rate obtained from the above CD control, which is more accurate than the etching rate used in a known method, and this feature is different from the known technique.

Hereinabove, the four embodiments of the present invention are described, but these embodiments are preferred embodiments of the present invention, and should not be construed as limiting the scope of the present invention.

Next, an example of a method for producing a semiconductor device using the dry etching equipment 1 is described with reference to FIG. 15.

Figure 15:
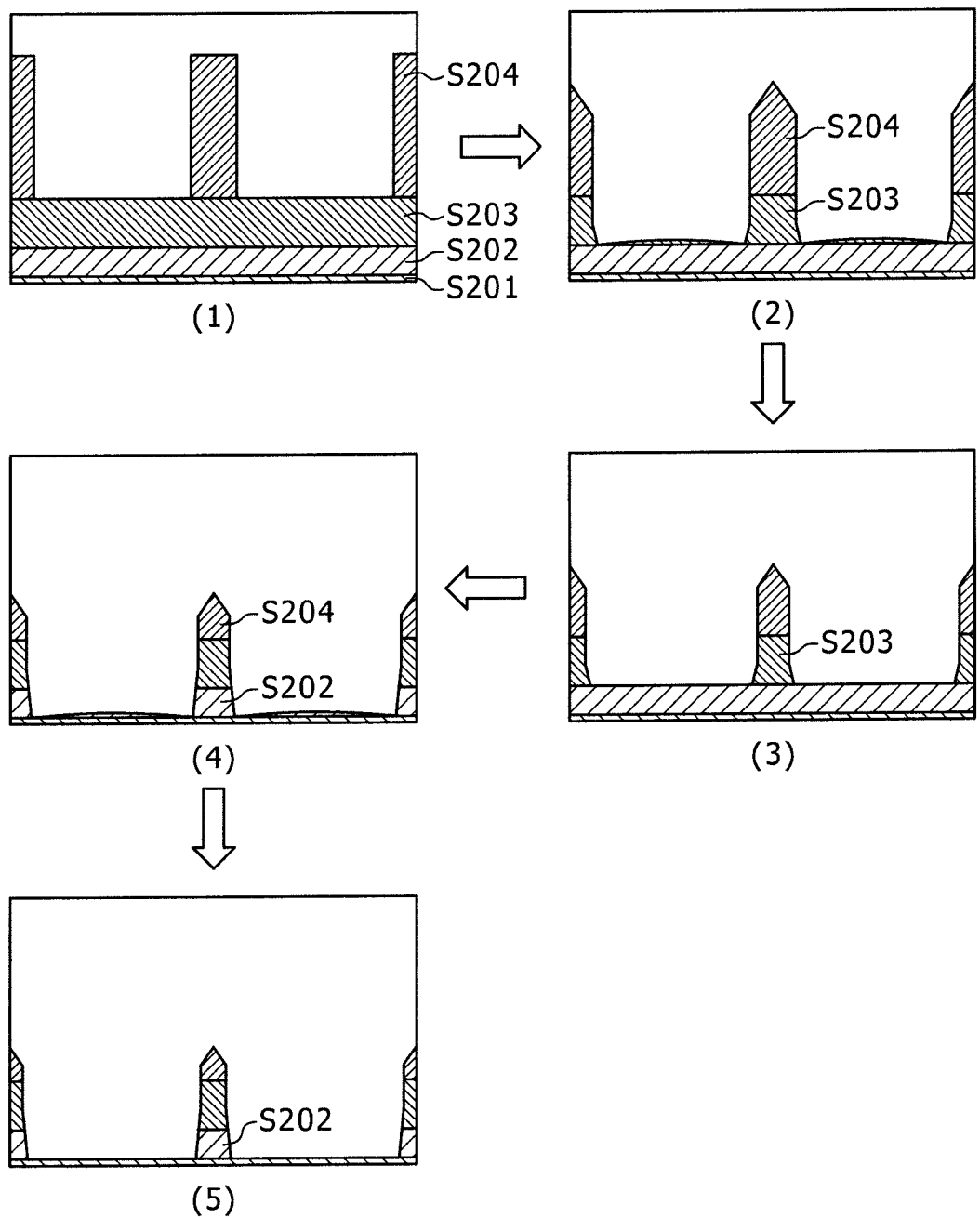
FIG. 15 is a simulation image showing a method for producing a semiconductor device by dry etching according to an embodiment of the present invention.
Figure 16:
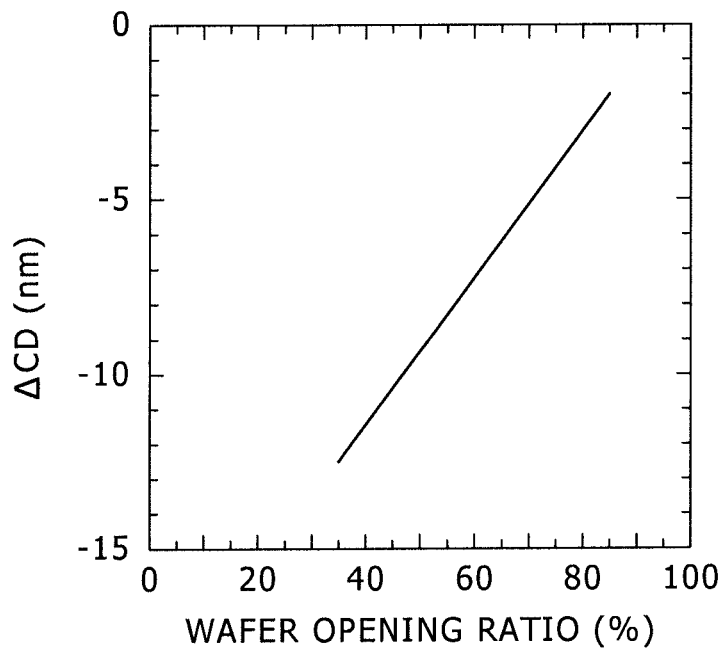
FIG. 16 is a graph showing the relationship between a wafer opening ratio and a gate dimension transfer difference $\Delta CD$.
Figure 17:
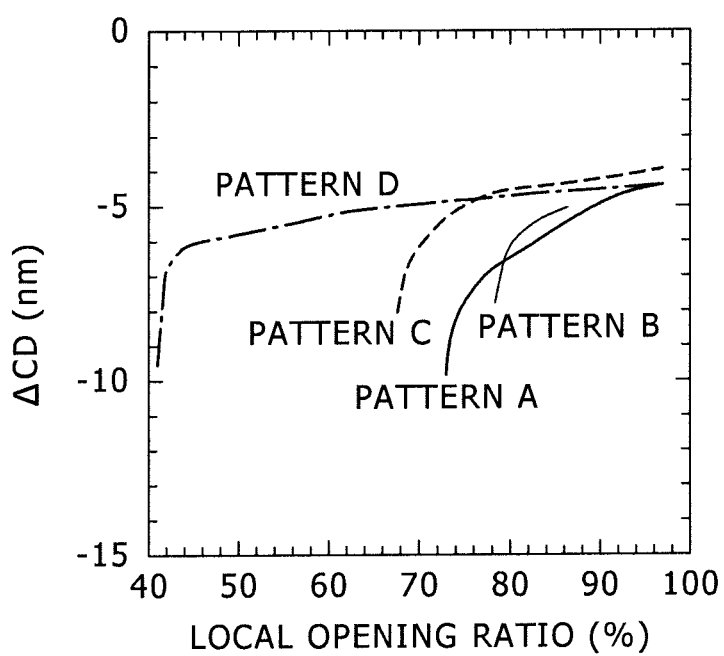
FIG. 17 is a graph showing the relationship between an opening ratio in a local region and a gate dimension transfer difference $\Delta CD$.
Figure 18:
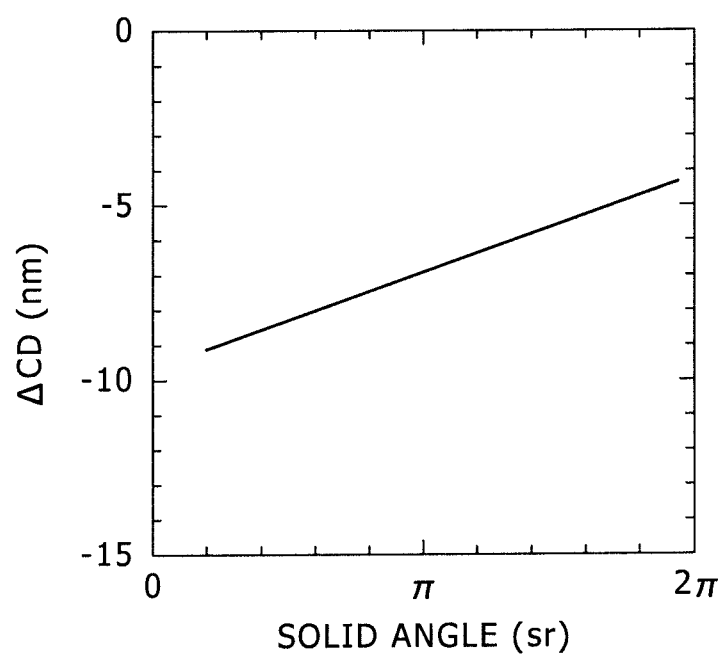
FIG. 18 is a graph showing the relationship between a solid angle of a local pattern and a gate dimension transfer difference $\Delta CD$.

As shown in FIG. 15(1), on a semiconductor substrate (not shown) are stacked a gate oxide film 201, a polysilicon film 202, and an antireflection coating film 203 in this order from the bottom, and on the antireflection coating film 203 is formed a resist pattern 204 which serves as an etching mask in forming a desired gate electrode.

Etching is then performed using the dry etching equipment 1 according to embodiments of the present invention. The etching may be performed by any of the methods in the above first to fourth embodiments. As shown in FIG. 15(2), the antireflection coating film 203 is first etched using the resist pattern 204 as an etching mask.

Then, as shown in FIG. 15(3), the antireflection coating film 203 is overetched.

Subsequently, as shown in FIG. 15(4), the polysilicon film 202 is etched by using the resist pattern 204 as an etching mask.

Then, as shown in FIG. 15(5), the polysilicon film 202 is overetched.

In the etching for each film, the etching topography is always simulated according to the algorithm described above in the first to fourth embodiments, and the etching proceeds while feeding a correction value for etching back to the etching chamber, suppressing the variation in the critical dimension.

In the above method for producing a semiconductor device, the dry etching equipment 1 according to embodiments of the present invention is used in etching, and therefore etching with a variation on the nanometer scale in the critical dimension (CD) is achieved, thereby making it possible to form a pattern with high accuracy.

By using this method, etching meeting the requirement of micropatterns in a next generation of devices can be achieved, and therefore reliability or yield depending on the critical dimension is advantageously improved.

The etching process for forming a gate electrode is described above, but the method for producing a semiconductor device of the present invention is not limited to the etching process for forming a gate electrode, and, with respect to the object to be etched, there is no particular limitation as long as a pattern is formed by an etching process in the method, and, with respect to the constituents of films in the object to be etched, there is no particular limitation. Further, the method of the present invention is also applied to etching for substrate. Therefore, the method of the present invention can be applied to any etching processes.

Thus, by using the dry etching equipment according to embodiments of the present invention in etching for micropatterns in a next generation of devices, a variation on the dimension can be suppressed with higher accuracy, and the cost for examining etching conditions can be dramatically reduced. Therefore, the reliability or yield depending on the critical dimension is advantageously improved.

In the method for producing a semiconductor device according to embodiments of the present invention, etching with a variation on the nanometer scale in the critical dimension (CD) is achieved, and etching meeting the requirement of micropatterns in a next generation of devices can be made, and therefore reliability or yield depending on the critical dimension is advantageously improved.

It should be understood by those skilled in the art that various modifications, combinations, sub-combinations and alternations may occur depending on design requirements and other factors insofar as they are within the scope of the appended claims or equivalents thereof.

What is claimed is:

1. A dry etching equipment comprising:
    an etching chamber comprising a semiconductor wafer;
    at least one sensor configured to sense at least one plasma condition in the etching chamber during an etching process that etches a pattern into the semiconductor wafer;
    a processor; and
    a non-transitory memory including instructions, which when executed by the processor, cause the processor to:
        calculate a solid angle based on data for the pattern
        receive the at least one plasma condition from the at least one sensor,
        determine, based on the sensed at least one plasma condition, a reaction product flux at a location in the etching chamber above the pattern,
        estimate, according to a multiplication of the determined reaction product flux and the calculated solid angle, an amount of deposition species incident upon a sidewall of the pattern,
        calculate, based on the estimated amount of deposition species incident upon the sidewall, a correction for at least one process parameter that affects a critical dimension of the pattern, and
        control, in real time, the at least one process parameter based on the correction to bring the critical dimension within a predetermined tolerance range.

2. The dry etching equipment according to claim 1, wherein the at least one plasma condition includes a plasma density, a plasma light-emission intensity, an electron temperature, an ion flux, a radical flux, or an ion energy.

3. The dry etching equipment according to claim 1, wherein the at least one process parameter includes at least one of a gas pressure, a gas type, a gas flow rate, a source power, a bias power, a top power, and a lower electrode temperature.

4. The dry etching equipment according to claim 3, wherein the gas type includes a hydrogen bromide gas, an oxygen gas, and a chlorine gas.

5. The dry etching equipment according to claim 4, wherein the deposition species incident upon the sidewall comprises one or more of $SiBr_x$ and $SiO_xBr_y$.

6. The dry etching equipment according to claim 1, wherein the instructions cause the processor to estimate an etching rate and a deposition rate based on the amount of deposition species incident upon the sidewall.

7. The dry etching equipment according to claim 6, wherein the instructions cause the processor to estimate progress of the etching process based on the etching rate and the deposition rate.

8. The dry etching equipment according to claim 7, wherein the instructions cause the processor to determine that the etching process is complete based on the estimated progress of the etching process.

9. The dry etching equipment according to claim 1, wherein the instructions cause the processor to:
    terminate the etching process upon determining that the etching process is complete.

10. The dry etching equipment according to claim 9, wherein the instructions cause the processor to:
    upon termination of the etching process, measure at least one of the critical dimension, a taper angle, and a photoresist residue amount.

* * * * *